(12) United States Patent
Iida

(10) Patent No.: US 7,569,820 B2
(45) Date of Patent: Aug. 4, 2009

(54) INFRARED SENSOR AND METHOD OF DRIVING THEREOF

(75) Inventor: Yoshinori Iida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 857 days.

(21) Appl. No.: 11/228,344

(22) Filed: Sep. 19, 2005

(65) Prior Publication Data

US 2006/0208188 A1    Sep. 21, 2006

(30) Foreign Application Priority Data

Sep. 24, 2004 (JP) ............................. 2004-278265
May 24, 2005 (JP) ............................. 2005-151312

(51) Int. Cl.
*G01J 5/00* (2006.01)

(52) U.S. Cl. ...................... 250/330; 250/332

(58) Field of Classification Search ................ 250/330, 250/332
See application file for complete search history.

(56) References Cited

U.S. PATENT DOCUMENTS

| | | | |
|---|---|---|---|
| 6,759,657 B2 | 7/2004 | Iida et al. | |
| 6,809,320 B2 | 10/2004 | Iida et al. | |
| 7,184,085 B2 * | 2/2007 | Hakamata et al. | ........... 348/311 |
| 7,361,899 B2 * | 4/2008 | Iida | ........................ 250/338.4 |
| 2004/0159788 A1 | 8/2004 | Shigenaka et al. | |

FOREIGN PATENT DOCUMENTS

| | | | |
|---|---|---|---|
| JP | 07087399 A | * | 3/1995 |
| JP | 2003-110938 | | 4/2003 |
| JP | 2003-198931 | | 7/2003 |

OTHER PUBLICATIONS

Tomohiro Ishikawa, et al., "Low-cost 320×240 uncooled IRFPA using conventional silicon IC process", Part of the SPIE Conference on Infrared Technology and Applications XXV, vol. 3698, Apr. 1999, pp. 556-564.

* cited by examiner

*Primary Examiner*—Constantine Hannaher
(74) *Attorney, Agent, or Firm*—Oblon, Spivak, McClelland, Maier & Neustadt, P.C.

(57) ABSTRACT

An infrared sensor includes an imaging area including a thermal non-sensitivity pixel row, an optical non-sensitivity pixel row and a valid pixel row, and the infrared sensor including a column amplifier including a first amplifying transistor, a first clamp circuit, an integration capacitor, and a resetting part connected to the drain of the first amplifying transistor and a storage node of the integration capacitor, the column amplifier being connected to the signal lines, and amplifying a signal voltage generated in the signal line; a column buffer including a driving transistor, a drain of the driving transistor being connected to a source of the first amplifying transistor; a readout circuit connected to the storage node of the integration capacitor; and a signal generating circuit including a circuit configuration equivalent to that of the column amplifier and including a second amplifying transistor equivalent to the first amplifying transistor, a gate of the second amplifying transistor connected to a gate of the driving transistor.

19 Claims, 19 Drawing Sheets

INFRARED SENSOR AND METHOD OF DRIVING THEREOF

CROSS-REFERENCE TO RELATED APPLICATIONS

This application is based upon and claims the benefit of priority from the prior Japanese Patent Applications No. 2004-278265, filed on Sep. 24, 2004, and the prior Japanese Patent Applications No. 2005-151312, filed on May 24, 2005, the entire contents of which are incorporated herein by reference.

BACKGROUND OF THE INVENTION

1. Field of the Invention

The present invention relates to an infrared sensor, and relates, for example, to an uncooled infrared sensor with a high-sensitivity and a wide dynamic range.

2. Background Art

Infrared imaging has an advantage of being able to image during day and night, and has higher permeability in smoke and fog than imaging by visible light. Furthermore, infrared imaging can obtain temperature information of an object. Therefore, infrared imaging has a wide range of application to security fields and the like, as a monitoring camera and a fire detecting camera.

The largest drawback of a quantum type infrared solid-state imaging device as a conventional main device is that the infrared solid-state imaging device requires a cooling mechanism to carry out a low-temperature operation. In recent years, a "non-cooled infrared solid-state imaging device" which does not require this cooling mechanism is being developed progressively. The uncooled or thermal type infrared solid-state imaging device converts an incident infrared ray having a wavelength of about 10 μm into heat using an absorption structure. A thermoelectric converter converts a change in the temperature of a heat sensing section generated by weak heat into an electric signal. The thermal type infrared solid-state imaging device reads this electric signal to obtain infrared image information. For example, an infrared sensor using a silicon pn junction that converts a temperature change into a voltage change based on a constant forward current is reported (see, Tomohiro Ishikawa, et al., Proc. SPIE Vol. 3698, p. 556, 1999).

The uncooled infrared sensor with a silicon pn-junction reads a signal as follows. When a forward current is passed to a pn-junction that is disposed in each pixel and thermally isolated from a substrate, the infrared sensor reads a voltage corresponding to an operation point that changes based on the temperature of the pn-junction. In this system, a silicon on insulator (SOI) substrate is used for a semiconductor substrate. The sensor can be manufactured in only a silicon LSI process, and this manufacturing method is suitable for mass production. A function of a row selection is realized by using rectification characteristics of the silicon pn-junction as a thermoelectric converter. Therefore, a pixel structure is extremely simple.

Noise equivalent temperature difference (NETD) which represents temperature resolution of the infrared sensor is one of the indicators showing the performance of the infrared sensor.

It is important for the infrared sensor to decrease the NETD, that is, to decrease a temperature difference that becomes equivalent to noise. To meet this, it is necessary to increase the sensitivity as a signal and to decrease noise. In order to decrease noise, it is effective to increase a bias current as a measure for decreasing current shot noise. Based on this method, a differential resistivity of the pn-junction can be decreased.

However, along with the increase in the bias current, the following problems arise.

A bias current that flows through pixels disposed in parallel in the same row concentrates in the row selection line, which causes a voltage drop. Due to this voltage, drop, a voltage distribution is caused inside the row selection line, and an output signal is inclined to a horizontal direction, thereby causing shading.

In order to avoid this shading, there is proposed a method of taking a difference between a voltage in a reference voltage line and the output signal, by providing the reference voltage line having the same voltage distribution as that in the row selection line, as disclosed in Japanese Patent Application Laid-Open No. 2003-222555.

However, an uncooled infrared solid-state imaging device disclosed in Japanese Patent Application Laid-Open No. 2003-222555 has the following problems. When a bias current is passed to the pn-junction, Joule heat is generated in the pn-junction. Due to this Joule heat, self heating occurs in the pn-junction. For example, when a change in the temperature of an object is 1 K, a change in the temperature of the pixel pn-junction is only a few mK at most. However, the self heating becomes a few K to several dozens K, and buries a signal component. As a result, a large part of a dynamic range of a readout circuit is consumed, and an actual dynamic range is suppressed.

According to the Patent Literature 1, an exclusive reference voltage line (a bias line) is necessary, and a constant current source and a differential amplifier circuit need to be provided in each column. Therefore, the readout circuit becomes complex. Consequently, a sophisticated shading correction method is required.

SUMMARY OF THE INVENTION

In order to solve the above problems, an advantage of an aspect of the present invention is to provide an uncooled infrared solid-state imaging device that can ensure a wide dynamic range without making a readout circuit complex.

An infrared sensor according to an embodiment of the present invention includes an imaging area which infrared detection pixels are disposed on a semiconductor substrate, the imaging area including a row of thermal non-sensitivity pixels, a row of optical non-sensitivity pixels and a row of valid pixels detecting infrared, and including a column of optical non-sensitivity pixels in an area of the valid pixels row;

row selection lines disposed in a row direction within the imaging area;

signal lines disposed in a column direction within the imaging area;

a row selecting circuit connected to the row selection lines;

a column amplifier including a first coupling capacitor, a first amplifying transistor, a first clamp circuit, an integration capacitor and a resetting part, a gate of the first amplifying transistor, being connected to one of the signal lines via the first coupling capacitor, the first clamp circuit clamping a gate voltage of the first amplification transistor at a clamping voltage, the integration capacitor being connected to a drain of the first amplifying transistor, the resetting part being connected to the drain of the first amplifying transistor and a storage node of the integration capacitor, the column amplifier being connected to each of the signal lines and amplifying a signal voltage generated in the signal line;

a column buffer including a driving transistor, a source of the driving transistor being connected to a source of the first amplifying transistor;

a reading circuit that is connected to the storage node of the integration capacitor, and reads an output signal from the column amplifier; and a signal generating circuit for the column of the optical non-sensitivity pixel, the signal generating circuit including a circuit configuration equivalent to that of the column amplifier, the circuit configuration including a second amplifying transistor equivalent to the first amplifying transistor, a gate of the second transistor being connected to a gate of the driving transistor.

A method of driving an infrared sensor according to an embodiment of the present invention, the infrared sensor including an amplifying transistor including a gate capacity coupled with signal lines connected to a thermal non-sensitivity pixel row, an optical non-sensitivity pixel row, and a valid pixel row; a clamp circuit clamping a gate voltage of the amplifying transistor at a clamping voltage; a capacitor connected to a drain of the amplifying transistor and storing a signal charge from the amplifying transistor; a resetting part resetting a drain potential of the amplifying transistor and a potential of the storage capacitor; and a column amplifier connected to the signal lines and amplifying a signal voltage generated in the signal lines, the method includes making the clamp circuit conductive only during a selection of the thermal non-sensitivity pixel row.

A method of driving an infrared sensor according to an embodiment of the present invention, the infrared sensor including a gate capacity which is coupled with signal lines connected to a thermal non-sensitivity pixel row, an optical non-sensitivity pixel row, and a valid pixel row; a clamp circuit clamping a gate voltage of the first amplifying transistor at a clamping voltage; a capacitor connected to a drain of the first amplifying transistor and storing a signal charge from the first amplifying transistor; a resetting part resetting a drain potential of the first amplifying transistor and a potential of the storage capacitor; a column amplifier connected to the signal lines and amplifying a signal voltage generated in the signal lines; a first current source connected to the signal lines of the optical non-sensitivity pixel column; and a second current source connected to the signal lines of a valid pixel column, the method includes making the clamp circuit conductive during a selection of the thermal non-sensitivity pixel row; and controlling a current from the first current source in a pulse shape in synchronism with the operation of the clamp circuit.

According to one aspect of the present invention, a self heating component generated in an optical non-sensitivity pixel column is fed back to a source voltage of an amplifier transistor in a column amplifier circuit. Therefore, a self heating component substantially larger than a signal component can be cancelled. Since a dynamic range of the column amplifier circuit can be fully utilized, an uncooled infrared sensor having wide dynamic range characteristics can be obtained.

Furthermore, a gate voltage of the amplifying transistor in the column amplifier circuit is clamped while selecting a non-sensitivity pixel row. Therefore, a voltage distribution of a row selection line caused following the row selection operation is cancelled. As a result, shading in a horizontal direction can be prevented. Consequently, a forward bias current of the pixel pn junction having a thermoelectric conversion function can be increased, and a low-noise and high-sensitivity uncooled infrared sensor can be obtained.

According to one aspect of the present invention, a self heating component generated in an optical non-sensitivity pixel column is fed back to a source voltage of an amplifier transistor in a column amplifier circuit. Therefore, a self heating component substantially larger than a signal component can be cancelled. Since a dynamic range of the column amplifier circuit can be fully utilized, an uncooled infrared sensor having wide dynamic range characteristics can be obtained.

Furthermore, a gate voltage of the amplifying transistor in the column amplifier circuit is clamped while selecting a non-sensitivity pixel row. Therefore, a voltage distribution of a row selection line caused following the row selection operation is cancelled. As a result, shading in a horizontal direction can be prevented. Consequently, a forward bias current of the pixel pn junction having a thermoelectric conversion function can be increased, and a low-noise and high-sensitivity uncooled infrared sensor can be obtained.

DETAILED DESCRIPTION OF THE INVENTION

Embodiments of the present invention will be explained below with reference to the drawings.

First Embodiment

Figure 1:
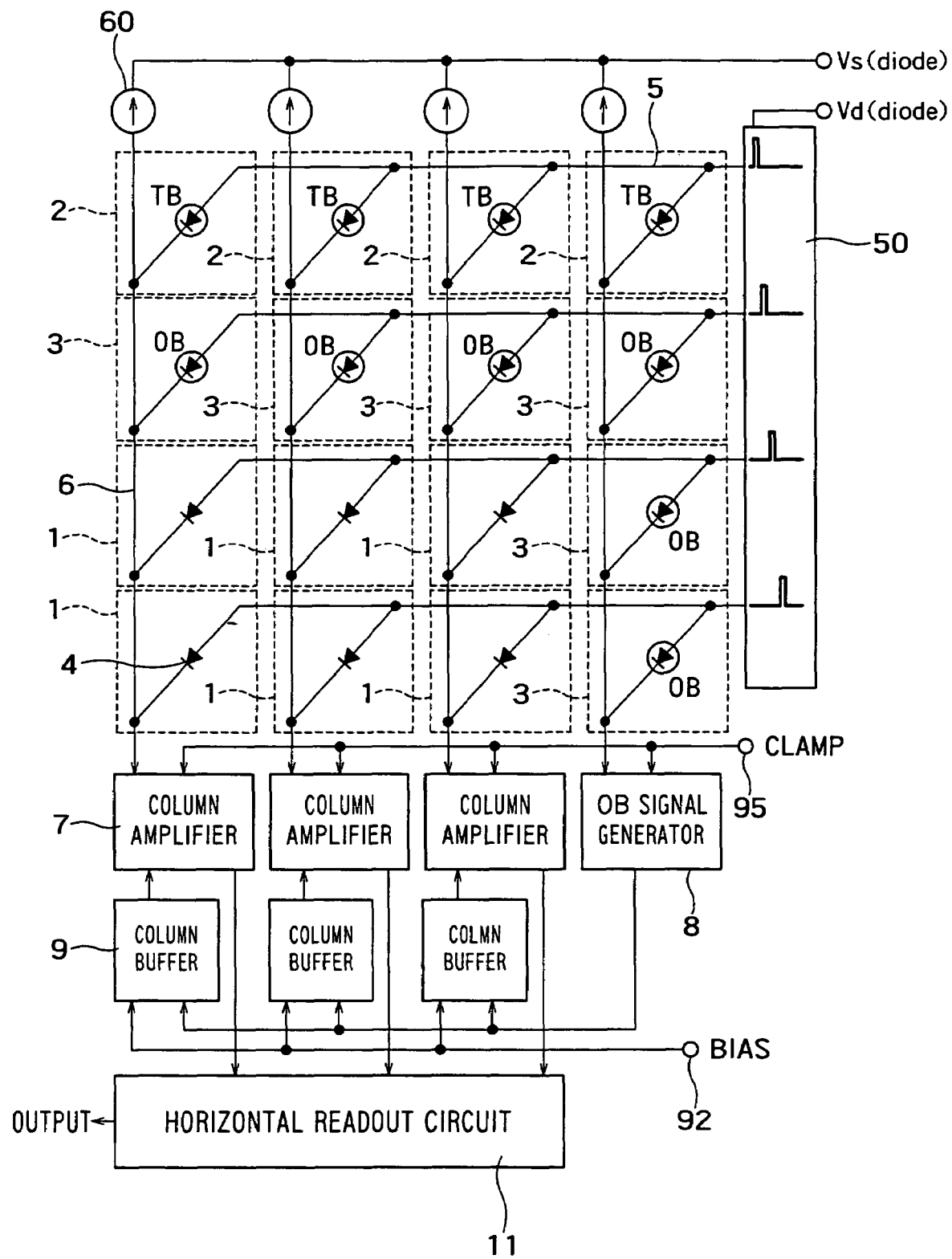
FIG. 1 is an explanatory diagram of an entire configuration of an infrared sensor according to a first or a second embodiment of the present invention.

FIG. 1 is an explanatory diagram of an entire configuration of an infrared sensor according to a first embodiment of the present invention. In FIG. 1, the sensor has 16 pixels in four rows and four columns. Four pixels in a first row are thermal non-sensitivity pixels 2 (TB: thermal black). Four pixels in a second row are optical non-sensitivity pixels 3 (OB: optical black). Six pixels in three columns of third and fourth rows, respectively are valid pixels 1. Pixels in the fourth column of the third and the fourth rows, respectively are optical non-sensitivity pixels 3.

A pn junction 4 is formed in each of the valid pixels 1, each of the thermal non-sensitivity pixels 2, and each of the optical non-sensitivity pixels 3, respectively. Each pn junction 4 is connected between a row selection line 5 and a vertical signal line 6. The row selection line 5 is connected to a row select circuit 50. By applying a pulse voltage to a row to be selected, the row selection line 5 forward biases the pn junctions in the pixels of the selected row, thereby carrying out a row selection operation. A constant current source 60 is connected to the vertical signal line 6 to forward bias the pn junction in the pixels of the selected row, thereby generating an output voltage to the vertical signal line 6. In this case, all pn junctions in the pixels of the non-selected rows are reversely biased, and therefore, are separated from the vertical signal line 6.

The vertical signal lines 6 in the three columns that include the valid pixels 1 are connected to column amplifiers 7. The vertical signal line of the optical non-sensitivity pixel column is connected to a thermal non-sensitivity (OB) signal generator 8. All of the column amplifiers 7 and the OB signal generator 8 have control inputs 72 to carry out a clamp operation, and carry out this clamp operation using a clamp pulse supplied from a clamp input 95. A self heating information signal generated from the OB signal generator 8 is input to a column buffer 9 disposed in each column. A voltage VS buffered by the column buffer 9 is supplied to the column amplifier 7 in each column. The column buffers 9 have a bias input (BIAS) 92 as a common input. A horizontal readout circuit 11 sequentially outputs from the column amplifiers 7.

Figure 2:
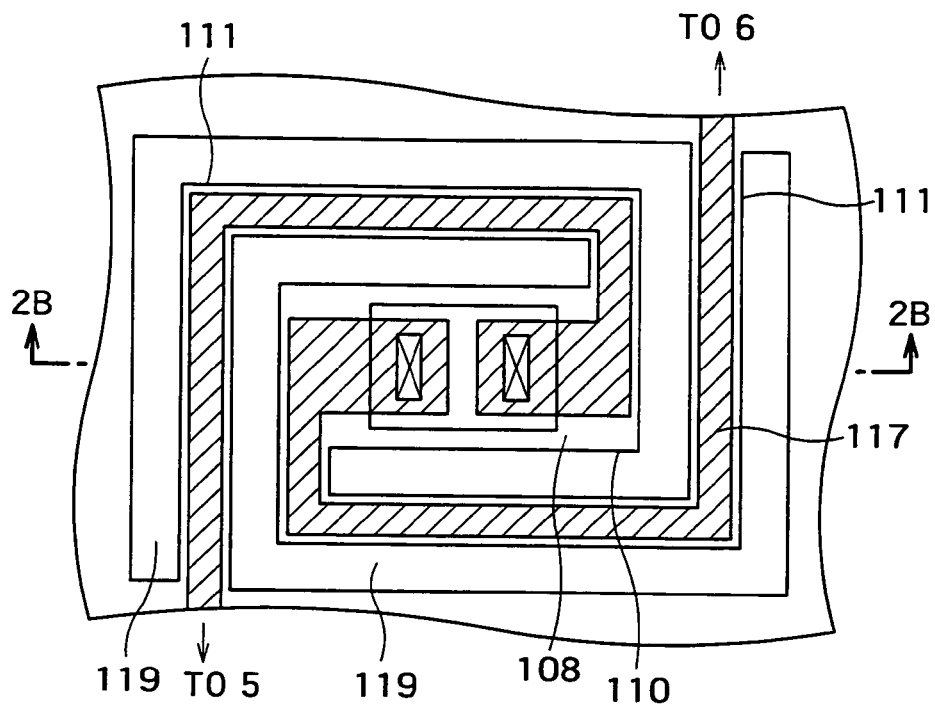
FIG. 2 is a top plan view showing a construction of an infrared detection pixel according to the embodiment of the present invention.
Figure 3:
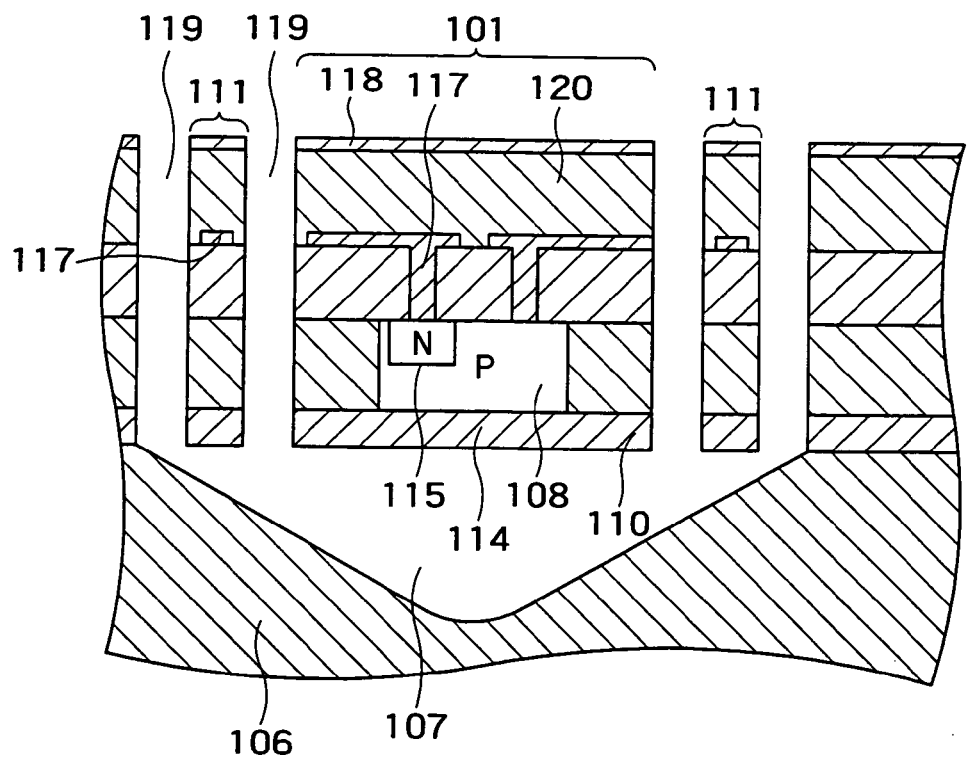
FIG. 3 is a cross-sectional view taken along with line 2B-2B in FIG. 2.

FIG. 2 is a top plan view of the valid pixel 1, and FIG. 3 is a cross-sectional view of the valid pixel 1 cut along line 2B-2B in FIG. 2. As shown in FIG. 3, the valid pixel 1 is supported above a hollow portion 107 provided on a semiconductor substrate surface 106. An infrared ray incident from above the valid pixel 1 in FIG. 3 is absorbed in absorption layers 118 and 120 on the front surface side, and becomes thermal energy. The thermal energy increases the temperature of a thermoelectric converter 101 that includes the pn junction supported in the hollow.

Figure 4:
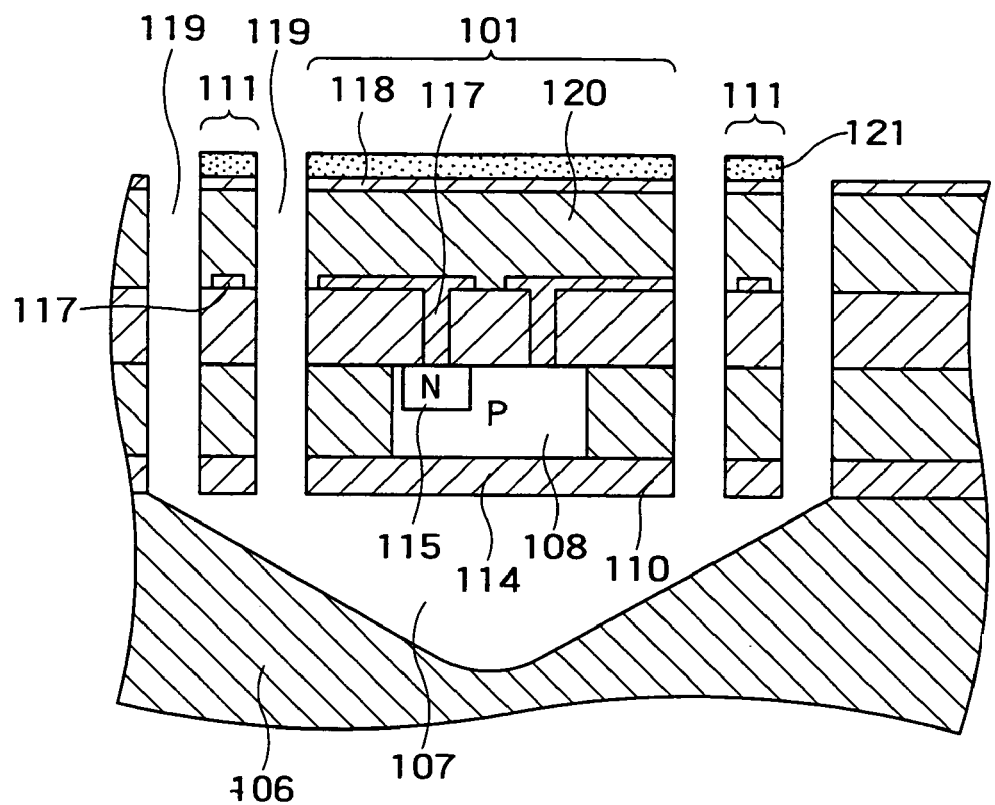
FIG. 4 is a cross-sectional view showing a construction of an optical non-sensitivity pixel according to the embodiment of the present invention.

FIG. 4 is a cross-sectional view of an optical non-sensitivity pixel 3. Constituent parts similar to those in FIG. 3 are assigned with like reference numerals. The optical non-sensitivity pixel 3 has a light shielding film 121 made of a metal layer such as aluminum on the front surface side of the valid pixel 1, thereby preventing absorption of an incident infrared ray. While infrared sensitivity is not present, a self heating occurs when a bias current is passed the pn-junction.

Figure 5:
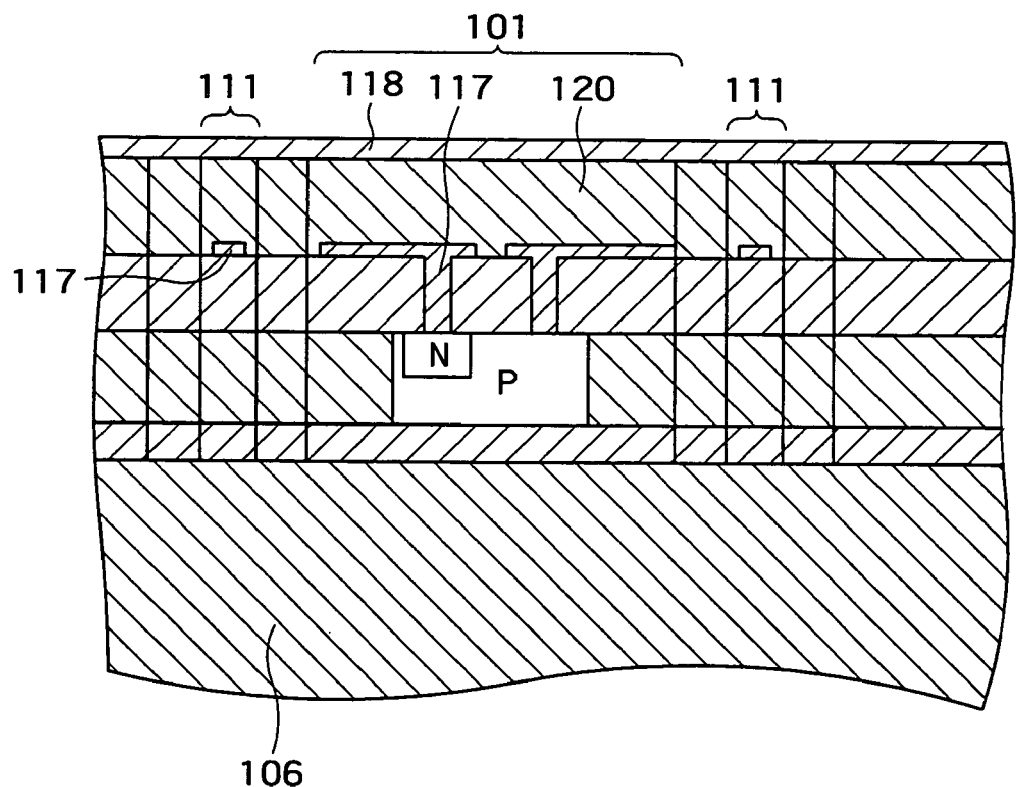
FIG. 5 is a cross-sectional view showing a construction of a thermal non-sensitivity pixel.

FIG. 5 is a cross-sectional view of a thermal non-sensitivity pixel 2. Constituent parts similar to those in FIG. 3 are assigned with like reference numerals. Unlike the valid pixel and the optical non-sensitivity pixel, the hollow portion 107 and an etching hole 119 are not formed on the thermal non-sensitivity pixel 2, and a heat separation structure is not formed between the thermal non-sensitivity pixel 2 and the semiconductor substrate 106. The thermal non-sensitivity pixel 2 has no sensitivity to an incident infrared ray. Joule heat generated due to a flow of a bias current quickly escapes to the substrate. Therefore, self heating does not occur in the thermal non-sensitivity pixel 2.

FIG. 6 to FIG. 9 are examples of circuit configurations of the column amplifier 7, the column buffer 9, the OB signal generator 8, and the horizontal readout circuit 11 shown in FIG. 1.

Figure 6:
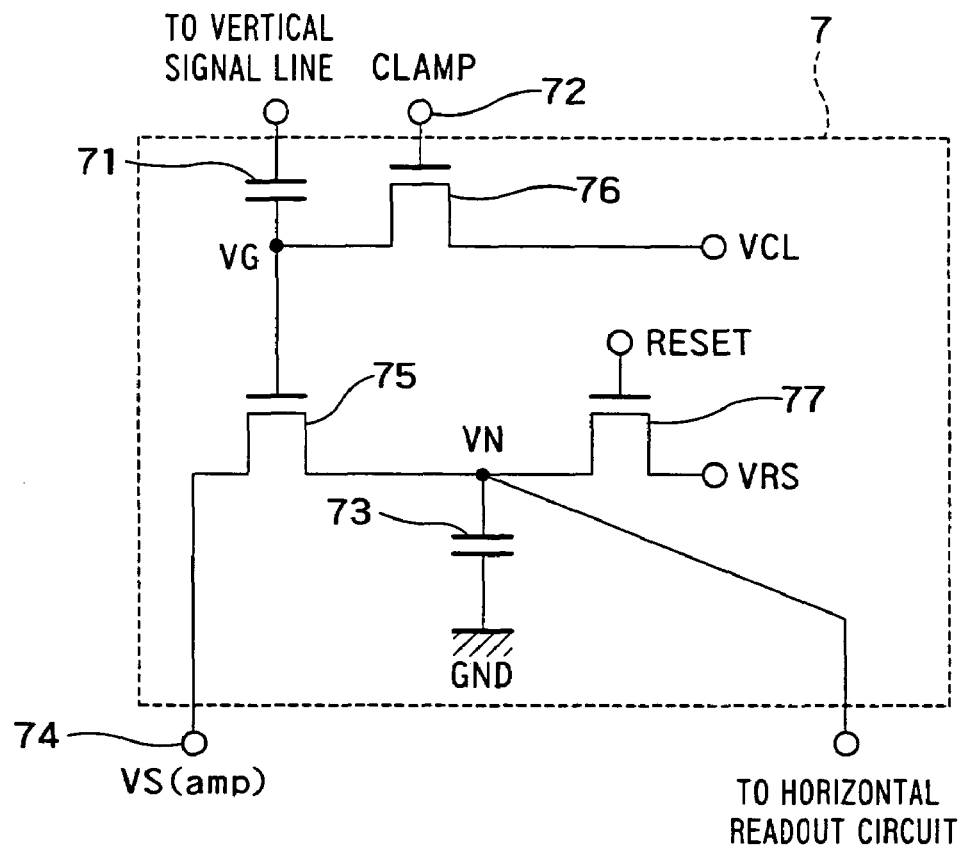
FIG. 6 is a circuit diagram of a column amplifier according to the first embodiment of the present invention.

The column amplifier 7 shown in FIG. 6 receives an input from the vertical signal line 6 with a first coupling capacitor 71, and clamps a gate voltage VG at a clamp voltage VCL, when a clamp input (CLAMP) 72 as a gate of a clamp transistor 76 becomes a high level. A gate modulation integration (GMI) circuit is formed which includes an amplifying transistor 75 that inputs the gate voltage VG, and a reset transistor 77 that charges an integration capacitor 73 at a reset pulse. When a reset pulse (RESET) becomes a high level, an integration capacitor Cs 73 is reset to a reset voltage VRS. After the reset pulse becomes low, a drain current of the amplifying transistor 75 generated at the gate voltage VG flows. As a result, a potential having a signal charge integrated together appears as a storage potential VN. A source voltage of the amplifying transistor 75 in the column amplifier 7 is supplied from the column buffer 9.

Figure 7:
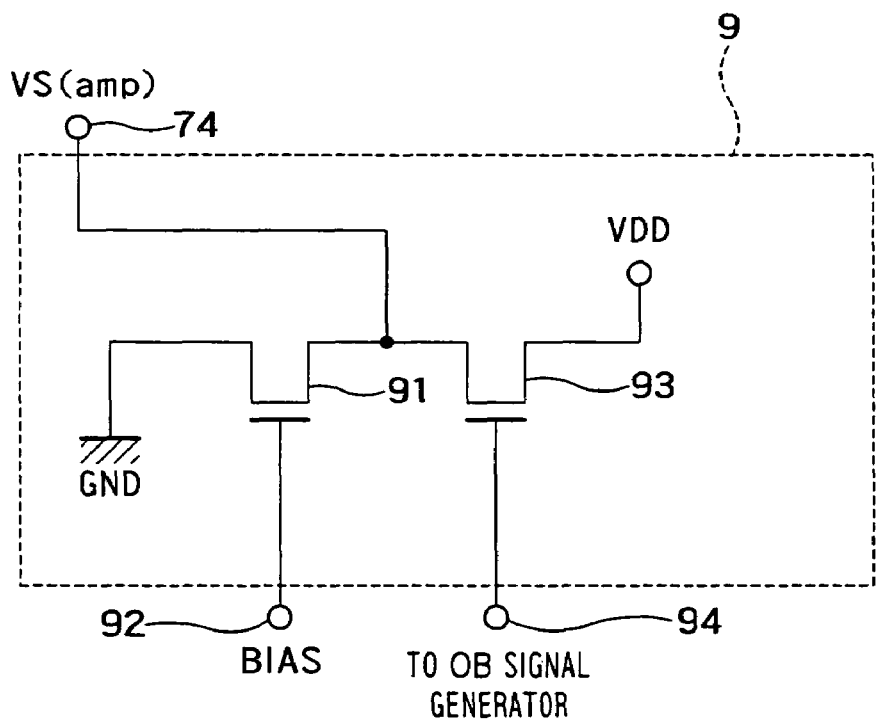
FIG. 7 is a circuit diagram of a column buffer according to the first embodiment of the present invention.

The column buffer 9 shown in FIG. 7 is what is called a source follower circuit. A gate input of a load transistor 91 is an external bias input 92. A gate 94 of a driving transistor 93 inputs a signal from the OB signal generator 8, and an output of the column buffer 9 is connected to a source terminal 74 of the amplifying transistor of the column amplifier 7.

Figure 8:
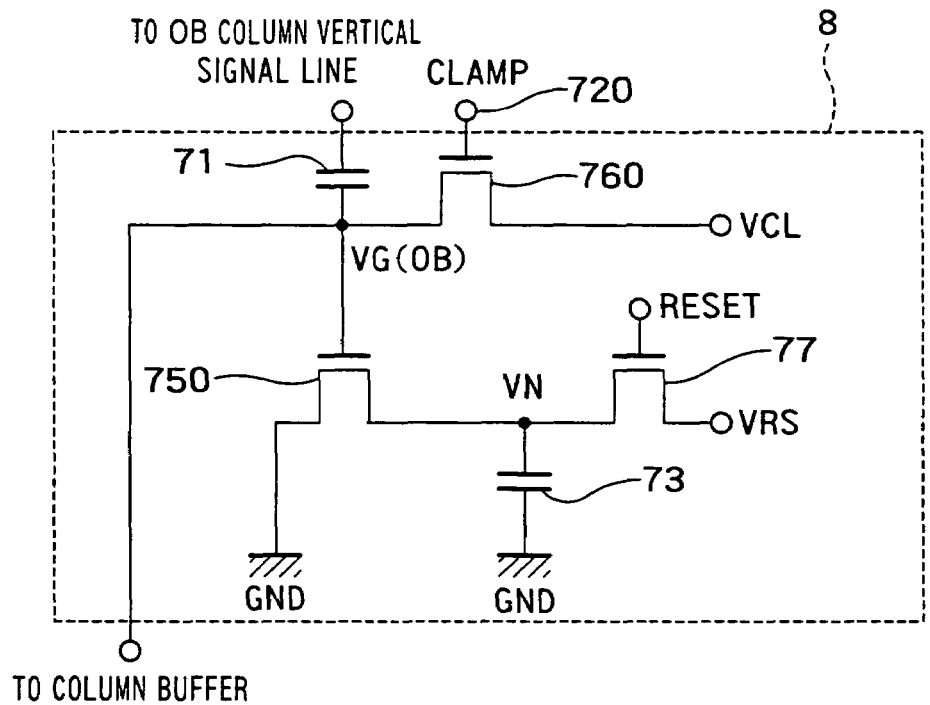
FIG. 8 is a circuit diagram of an OB signal generator according to the first embodiment of the present invention.

The OB signal generator 8 shown in FIG. 8 has a structure similar to that of the column amplifier 7 shown in FIG. 6. Based on a clamp pulse input from a clamp input (CLAMP) 720, a drain voltage VG (OB) of a clamp transistor 760 is clamped at the clamp voltage VCL. The gate voltage VG (OB) is an output signal, and is supplied to the gate input 94 of the driving transistor 93 of the column buffer 9.

Figure 9:
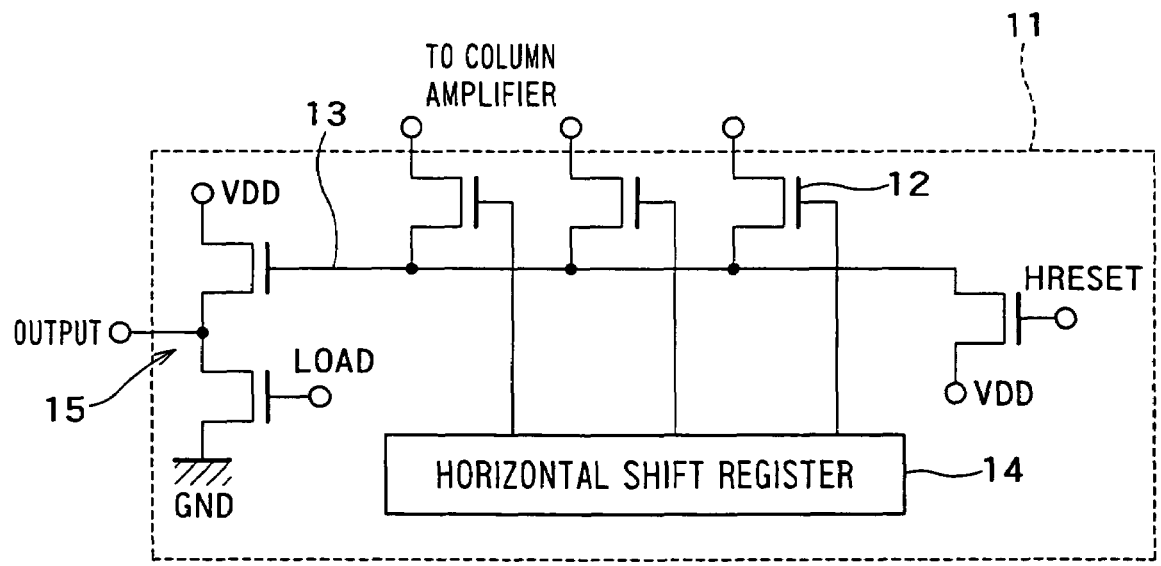
FIG. 9 is a circuit diagram of a horizontal readout circuit according to the first embodiment of the present invention.

In the horizontal readout circuit 11 shown in FIG. 9, a voltage VN of a storage electrode terminal of the integration capacitor 73 as an output of the column amplifier 7 is output to a reading line 13 via a horizontal select transistor 12. A select operation of the horizontal select transistor is carried out by a horizontal shift register 14. An output signal generated in the reading line 13 is output via a source follower circuit 15.

The output source follower circuit 15 shown in FIG. 9 can be an inverter amplifier circuit or other buffer circuits.

It is prefered to intervene a buffer circuit between the output of the column amplifier 7 and the readout circuit 11 for the purpose of readout the terminal voltage at the column amplifier output node VN in a non-destructive manner. The buffer circuit may be comprised by a source follower circuit.

Figure 10:
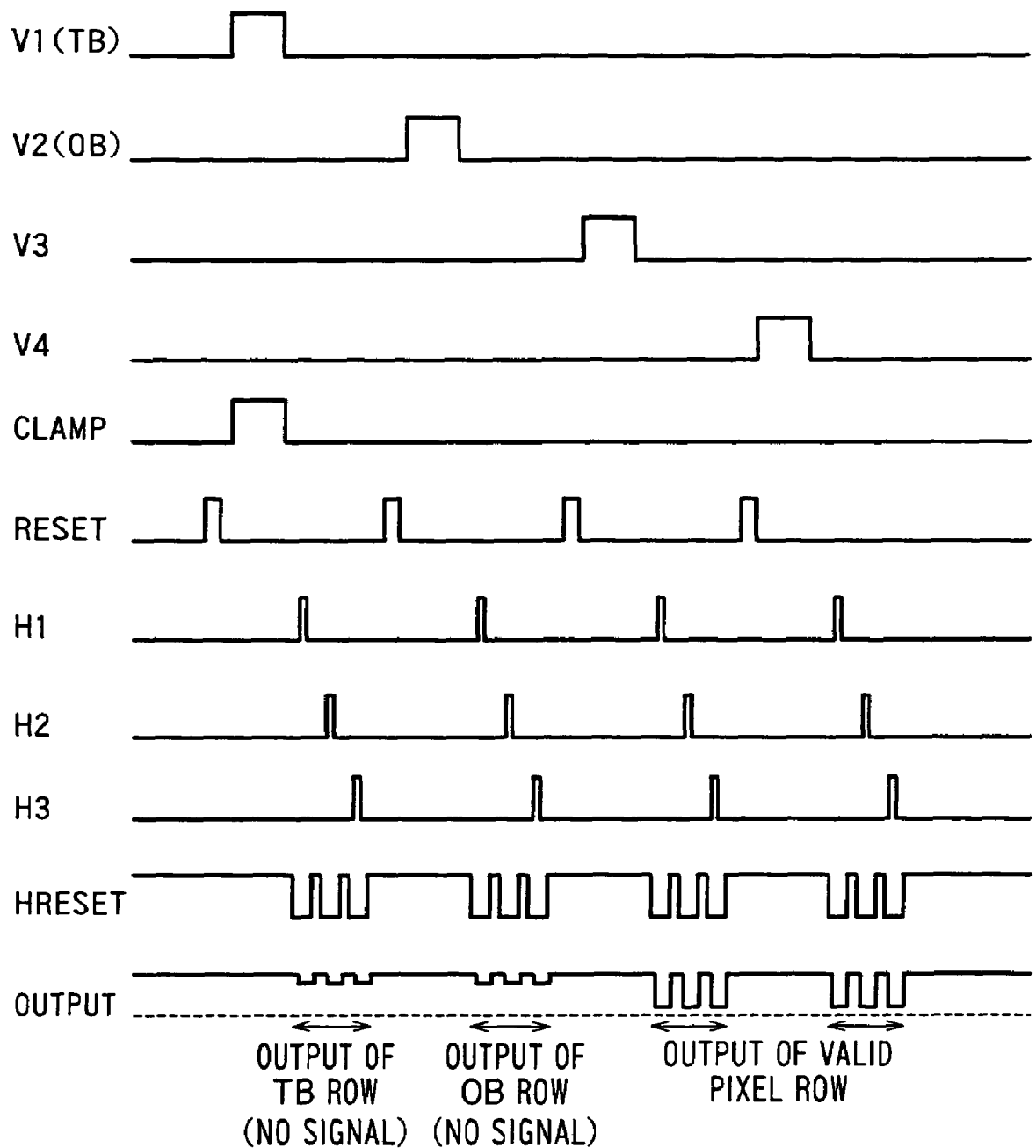
FIG. 10 is a driving timing chart of an infrared sensor according to the first embodiment of the present invention.
Figure 11:
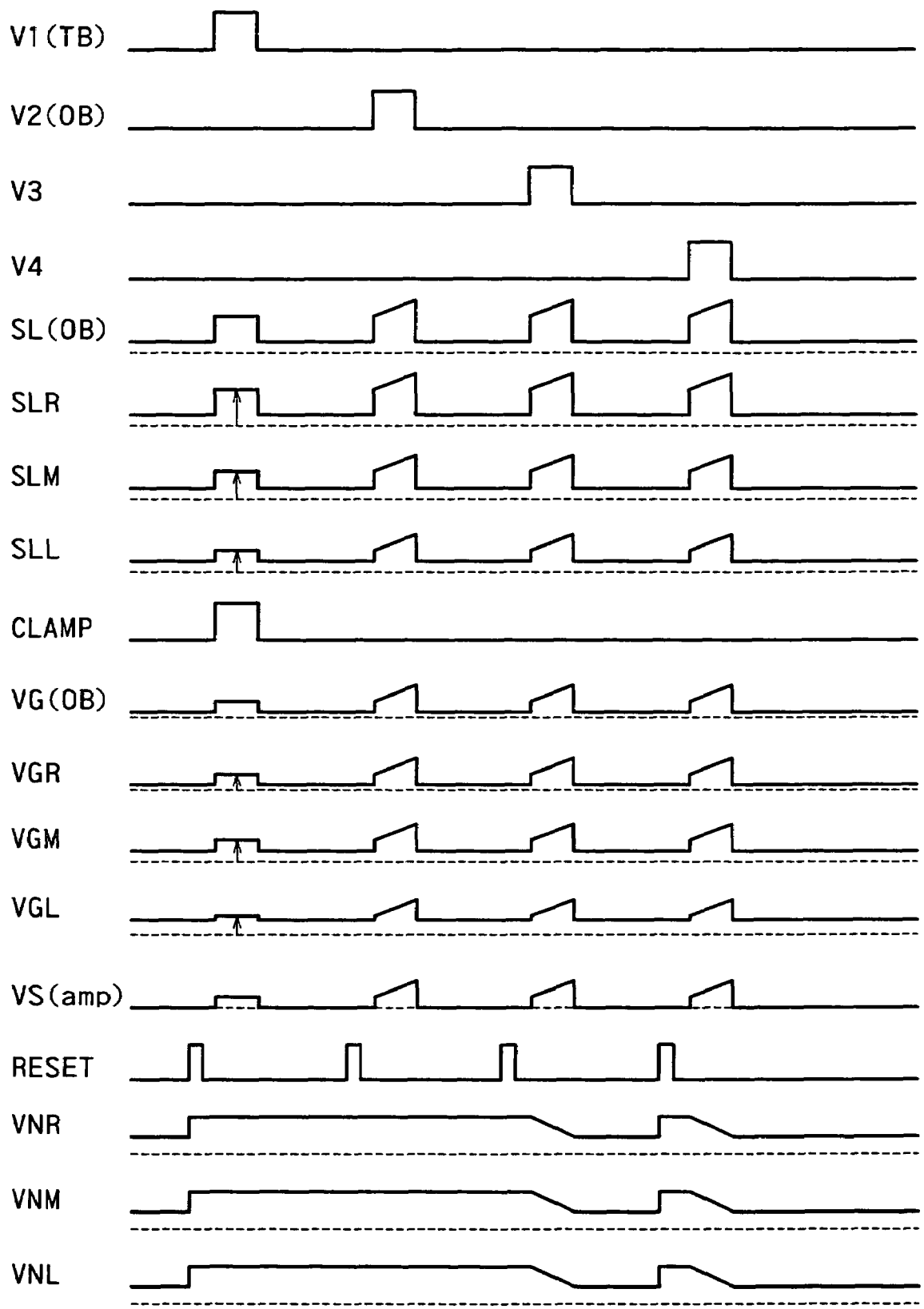
FIG. 11 is a driving timing chart showing a process of canceling the self heating signal and a process of preventing a shading in an infrared sensor according to the first embodiment of the present invention.

A method of driving the infrared sensor according to the present embodiment is explained with reference to FIG. 10 and FIG. 11. FIG. 10 shows one example of a timing chart for driving the infrared sensor shown in FIG. 1.

The integration capacitor 73 of the column amplifier 7 in each column shown in FIG. 6 is reset by the reset pulse (RESET). After that, a row selection pulse of the row select circuit 50 corresponding to a first row (V1) as a TB pixel row becomes a high level, and a voltage of Vsig (TB) is generated in the vertical signal line. The voltage Vsig (TB) is generated when a thermal non-sensitivity pixel row is selected, and this voltage becomes a background voltage of the optical non-sensitivity pixel row and the valid pixel row. When the clamp pulse is set to a high level simultaneously with the row selection pulse, the gate voltages VG and VG (OB) of the column amplifier 7 and the OB signal generator 8 are clamped at the clamp voltage VCL.

Therefore, when a thermal non-sensitivity pixel row is selected, a gate voltage of the amplifying transistor 75 becomes the clamp voltage VCL. In this case, the output of the OB signal generator 8 is also the clamp voltage VCL, and is given as a gate voltage of the driving transistor 93 in the column buffer 9. When a threshold voltage of the driving transistor 93 in the column buffer 9 is Vth, an output VS (amp) of the column buffer 9 becomes VCL−Vth. This voltage is applied as a source voltage of the column amplifier 7. In this case, a gate-source voltage Vgs of the amplifying transistor 75 inside the column amplifier becomes VCL−(VCL−Vth)= Vth. A current corresponding to the relationship between the gate-source voltage Vgs and the threshold voltage of the amplifying transistor 75 flows through the column amplifier 7, and changes a terminal voltage VN of the storage electrode of the integration capacitor 73. When the threshold voltage of the amplifying transistor 75 is equivalent to the threshold voltage of the driving transistor 93, no current flows through the column amplifier. Therefore, the voltage of the integration capacitor 73 remains at the reset voltage VRS, and VN becomes substantially equal to VRS. The following explanation is based on the assumption that the threshold voltage of the amplifying transistor 75 is equivalent to the threshold voltage of the driving transistor 93.

After a fall of a V1 pulse, the horizontal shift register 14 operates, and output pulses H1, H2, and H3 from the three columns are sequentially applied to the horizontal selection transistors 12 corresponding to the vertical signal lines 6 for the three columns. A horizontal reset pulse (HRESET) is used to reset a voltage signal read by the horizontal shift register to the reading line 13. The horizontal reset pulse (HRESET) becomes a high level after signals are read based on the output pulses H1, H2, and H3, thereby resetting the voltage of the reading line. In the flowchart of an output signal shown in FIG. 10, while the reading line 13 maintains a potential of VDD in the reset state, the terminal voltage VN (the reset voltage VRS in the first row) is generated in the reading line 13 when a signal voltage is output. The output is obtained from the first row in the state that the gate voltage of the amplifying transistor 75 is the clamp voltage VCL, and therefore, a dark output in a reference non-signal state is obtained.

The horizontal reset pulse HRESET is at a high level during a period in which the horizontal shift register 14 does not select the horizontal selection transistor 12. The reset voltage (VDD) is output to the reading line 13. An output of the source follower circuit using a potential of the reading line 13 as an input is generated as the output, and this behavior coincides with a behavior of the reading line potential.

Next, the integration capacitor is reset by the reset pulse RESET again, and all the column amplifiers are set to the same state. After that, a row selection pulse V2 in the second row as the optical non-sensitivity pixel row is set to a high level. At this time, a voltage that has the voltage Vsig (TB) added with the self heating component VSH (t) is generated in the vertical signal line 6. A potential of a VG node via the first coupling capacitor 71 becomes VCL+VSH (t) when the capacity of the first coupling capacitor 71 is sufficiently large. On the other hand, a VG (OB) node of the OB signal generator 8 also becomes substantially equivalent to VCL+VSH (t). Therefore, the gate-source voltage Vgs of the amplifying transistor 75 becomes substantially equal to the threshold voltage Vth like in the first row. As a result, a state of VN=VRS is maintained. Even when VSH (t) is added to the voltage component of the vertical signal line 6, the VN node voltage does not change from that in the first row. As a result, a dark output in the non-signal state is obtained from the output terminal. In other words, an output corresponding to a state that the potential of the reading line 13 is VRS is obtained.

In this case, VN is a dark output which is the same as that in the first row. In the first row, there is no self heating, and a steady voltage is generated in the vertical signal line. On the other hand, in the second row, the column amplifier 7, the OB signal generator 8, and the column buffer 9 operate based on a vertical signal line voltage that suddenly changes in a short time by self heating. Therefore, the following output that becomes a reference of reading a signal from the valid pixel row is obtained.

After the integration capacitor voltage within the column amplifier is rest by the reset pulse RESET again, a selection pulse V3 in the third row becomes a high level, and a valid pixel row is selected. At this time, a vertical signal line voltage at the time of selecting a thermal non-sensitivity pixel row added with a self heating signal VSH (t) from the optical non-sensitivity pixel is generated in the vertical signal line connected to the OB signal generator 8. In other words, Vsig (TB)+VSH (t) is generated. A voltage Vsig (TB)+VSH (t)+ Vsig, that is a sum of the vertical signal line voltage at the time of selecting a thermal non-sensitivity pixel row, the self heating signal VSH (t) from the valid pixel, and the valid signal Vsig, is generated in the vertical signal line connected to the column amplifier 7. Therefore, the components of the vertical signal line voltage at the time of selecting a thermal non-sensitivity pixel row Vsig (TB) and the self heating signal VSH (t) are cancelled. As a result, the gate-source voltage Vgs of the amplifying transistor within the column amplifier becomes Vgs=Vsig+Vth. A current corresponding to Vsig flows through the column amplifier, thereby modulating the potential of the integration capacitor. After a V3 pulse is generated, the horizontal shift register 14 operates like in the first row, and the pulses H1, H2, and H3 are generated. The voltage signals VN generated in the column amplifiers in the respective columns are sequentially output. The operation in the fourth row is the same as that in the third row.

The operation of each circuit is explained above based on a timing of a signal input to each input terminal. A process of canceling the self heating signal and the like (Vsig (TB) and VSH (t)) and a process of preventing a shading are explained with reference to FIG. 11. FIG. 11 shows voltages that are generated in the vertical signal lines in the respective columns based on a row selection pulse. These voltages include a voltage SL (OB) that is generated in the vertical signal line in the optical non-sensitivity pixel column, a voltage SLR that is generated in the vertical signal line in the valid pixel column at the row selecting circuit side, a voltage SLM that is generated in the vertical signal line in the center column, and a voltage SLL that is generated in the vertical signal line of the column furthest from the row selecting circuit. Similarly, gate voltages of the amplifying transistors 75 and 750 in the column amplifiers and the OB signal generator of the respective columns are expressed as VG (OB), VGR, VGM, and VGL. A source voltage VS (amp) of the column amplifier to which the output of the column buffer is input, an integration capacitor voltage VNR of the column amplifier 72 corresponding to the column at the row selecting circuit side, an integration capacitor voltage VNR of the column amplifier 72 corresponding to the center column, and an integration capacitor voltage VNL of the column amplifier 72 corresponding to the column furthest from the row selecting circuit are shown in the timing chart.

A selection pulse V1 (TB) in the first row becomes a high level, and a voltage output corresponding to a bias current appears in the vertical signal line output SL. At this time, as shown in SL (OB), SLR, SLM, and SLL, bias currents in all columns flow through the row selection line of the same row. Therefore, a voltage distribution is caused due to a voltage drop inside the row selection line 5, and the voltage distribution appears in the vertical signal line 6. These potential distributions are as shown by arrowheads in the signal waveforms of SLR, SLM, and SLL in FIG. 11. The vertical signal line output SLR in the column closest to the row selection circuit is highest, and the vertical signal line output decreases in the order of SLM and SLL. This is the shading.

At this time, the clamp pulse is also a high level. Therefore, as shown in FIG. 11, the gate voltages VGR, VGM, VGL, and VG (OB) of the OB signal generator and the column amplifier are all clamped at the clamp voltage VCL. In other words, regardless of a distance from the row selecting circuit, the gate voltages of the amplifying transistors in the column amplifier and the OB signal generator in all columns become the same voltage (VCL). These gate voltages are not affected by shading.

Since an output voltage VS (amp) of the column buffer 9 becomes VG−Vth, a stable voltage of VCL−Vth is generated. A gate-source voltage Vgs of the amplifying transistor 75 of the column amplifier 7 becomes Vth, and no current flows through the column amplifier. Therefore, the voltages VNR, VNM, and VNL of the storage electrodes of the integration capacitor 73 in the column amplifier 7 in each column are constant at the reset voltage VRS. These voltages are supplied to the horizontal selection transistor 12 in the horizontal readout circuit 11.

The reset pulse is set to a high level again, and then a pulse V2 (OB) for selecting the optical non-sensitivity pixel row of the second row becomes a high level. Since all pixels are optical non-sensitivity pixels in the second row, a voltage including a signal VSH (t) that changes along time due to a self heating is generated in the vertical signal line, and it appears in SL (OB), SLR, SLM, and SLL. At this time, it is understood that shading occurs because bias currents are concentrated in the row selection line, like in the first row.

However, like in the first row, the gate voltages VGR, VGM, VGR, and VG (OB) of the column amplifier and the OB signal generator are clamped when the first row is selected. Therefore, the shading is canceled. VCL+VSH (t) is generated in all of the gate voltages VGR, VGM, VGR, and VG (OB). At this time, the output VS (amp) of the OB signal generator 8 becomes VCL+VSH (t)−Vth. Therefore, Vgs (Vgs=VG−VS (amp)) becomes Vth. In other words, Vsig (TB) and VSH (t) are offset from Vgs of the amplifying transistor inside the column amplifier 7, and a self heating component is canceled.

In the second row, since all columns are optical non-sensitivity pixels, no current flows through the column amplifier. The integration capacitor voltages VNR, VNM, and VNL are all at the reset voltage VRS. In the second row, unlike in the first row, operation is carried out based on the optical non-sensitivity pixel output including a self heating component that changes along time. Therefore, it, is preferable to use an output obtained from the second row as dark output.

After a reset operation is carried out again, a row selection pulse V3 in the third row including the valid pixel is set to a high level. SL (OB), VG (OB), and VS (amp) are the same as those when the second row is selected, and an output corresponding to the optical non-sensitivity pixel output is generated.

On the other hand, a very small amount of a signal component Vsig that cannot be expressed in the drawing is generated in addition to the self heating component VSH (t), in the vertical signal lines SLR, SLM, and SLL. Therefore, the gate voltage VG becomes VCL+VSH (t)+Vsig. The source voltage VS (amp) is the same as that when the second row is driven, and becomes VCL+VSH (t)−Vth. Based on the clamp operation in the first row as described above, the shading is canceled in VGR, VGM, and VGL.

In this state, the gate-source voltage Vgs of the amplifying transistor 75 of the column amplifier 7 becomes Vsig+Vth. Furthermore, the threshold voltage of the amplifying transistor 75 becomes equivalent to the threshold voltage of the driving transistor 93 as described above. Therefore, Vsig+Vth after canceling the self heating component VSH (t) is generated. Accordingly, a current corresponding to Vsig flows through the column amplifier, and the voltages VNR, VNM, and VNL of the integration capacitor are modulated.

In the fourth row, the influence of self heating and shading are excluded based on the operation similar to that in the third row.

As explained above, according to the present embodiment, the source voltage VS (amp) including the self heating line component is input to the column amplifier 7. Based on this, the column amplifier 7 can output only a signal component not including the self heating component to the horizontal readout circuit 11. Since shading is not caused, the dynamic range of the column amplifier can be fully used. It is also possible to decrease noise by increasing bias current. Therefore, a high-sensitivity and wide dynamic range infrared sensor can be obtained.

Second Embodiment

Figure 12:
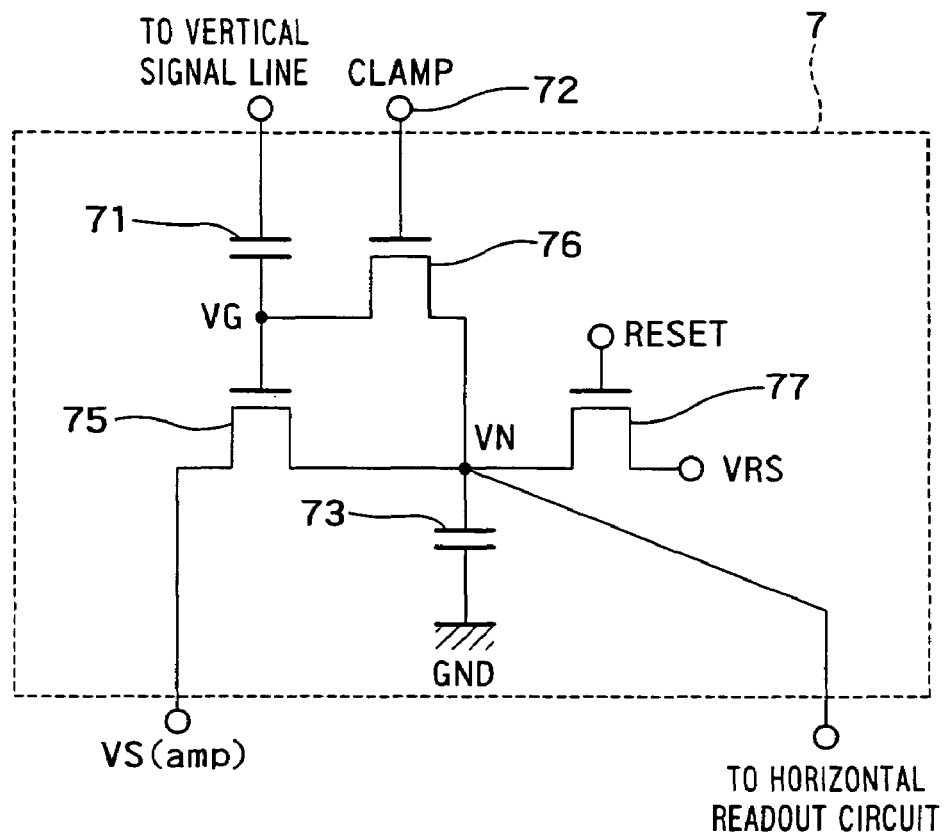
FIG. 12 is a circuit diagram of a column amplifier according to the second embodiment of the present invention.
Figure 13:
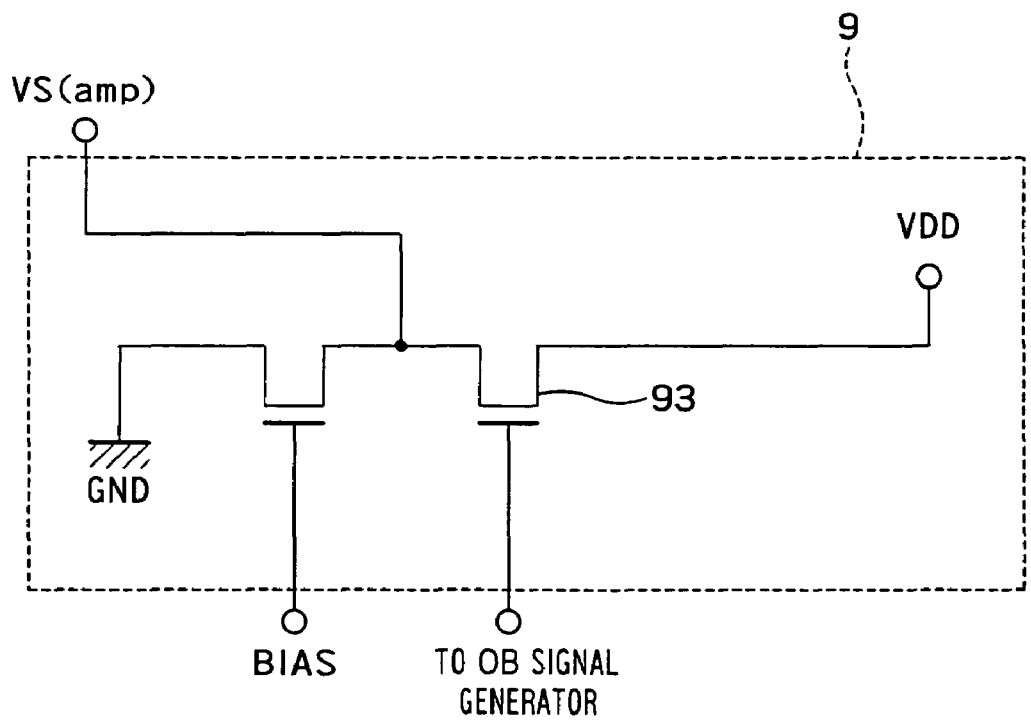
FIG. 13 is a circuit diagram of a column buffer according to the second embodiment of the present invention.
Figure 14:
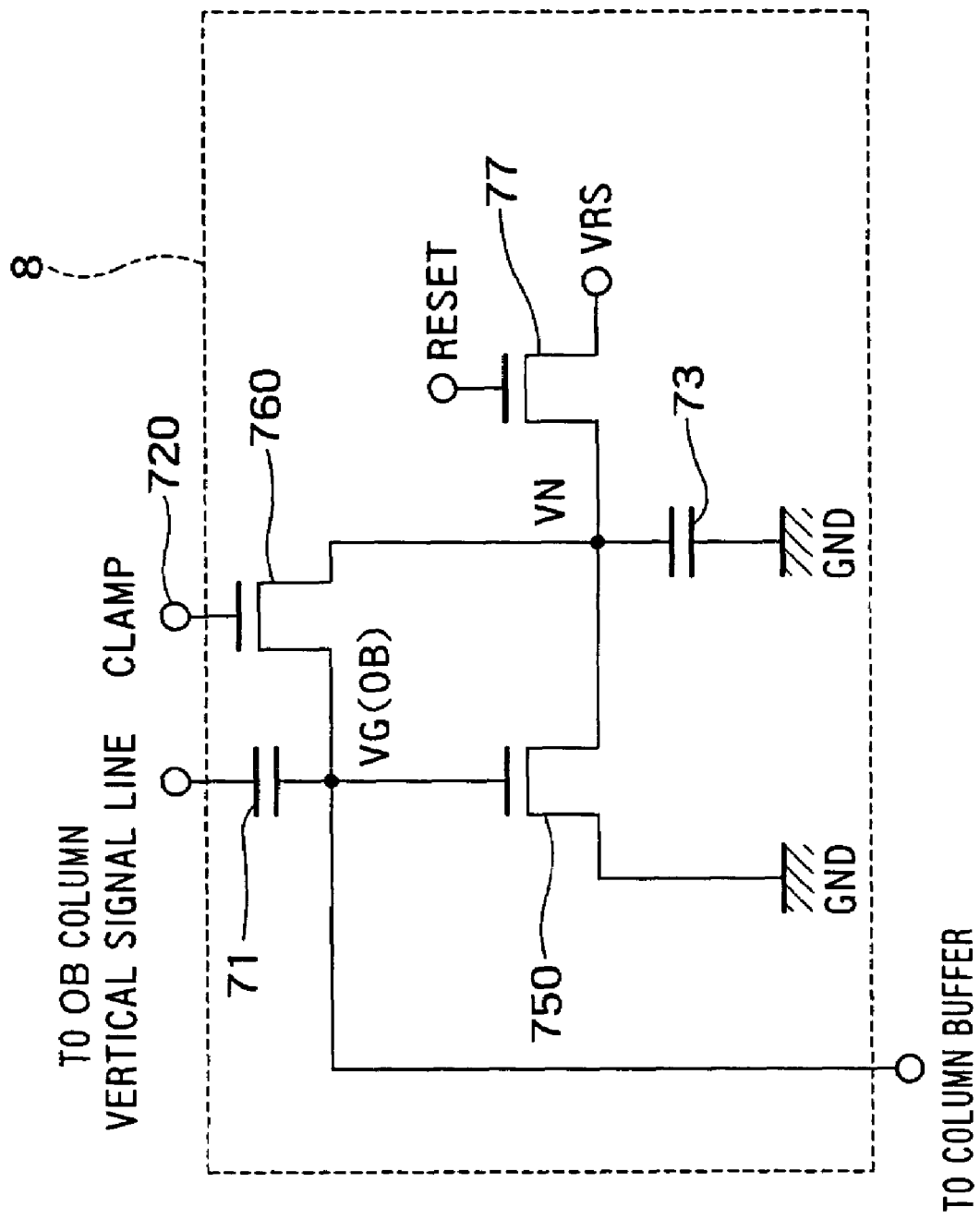
FIG. 14 is a circuit diagram of an OB signal generator according to the second embodiment of the present invention.

An infrared sensor according to a second embodiment of the present invention is explained next. FIG. 12 to FIG. 14 are explanatory diagrams of circuit configurations of a column amplifier, a column buffer, and an OB signal generator of the infrared sensor according to the second embodiment. FIG. 12 to FIG. 14 correspond to FIG. 6 to FIG. 8 according to the first embodiment. In FIG. 12 to FIG. 14, constituent parts that are identical with those in FIG. 6 to FIG. 8 are assigned with like reference numerals. An entire configuration of the infrared sensor is the same as that shown in FIG. 1. As shown in FIG. 12 and FIG. 14, according to the present embodiment, in the column amplifier and the OB signal generator, a clamp voltage for clamp operation is not supplied from the outside but is generated internally. This operation is different from the first embodiment.

In the column amplifier 7 shown in FIG. 12, one end of the clamp transistor 76 is not connected to the outside but is connected to a drain of the amplifying transistor 75. This also applies to the OB signal generator 8 shown in FIG. 14.

Figure 15:
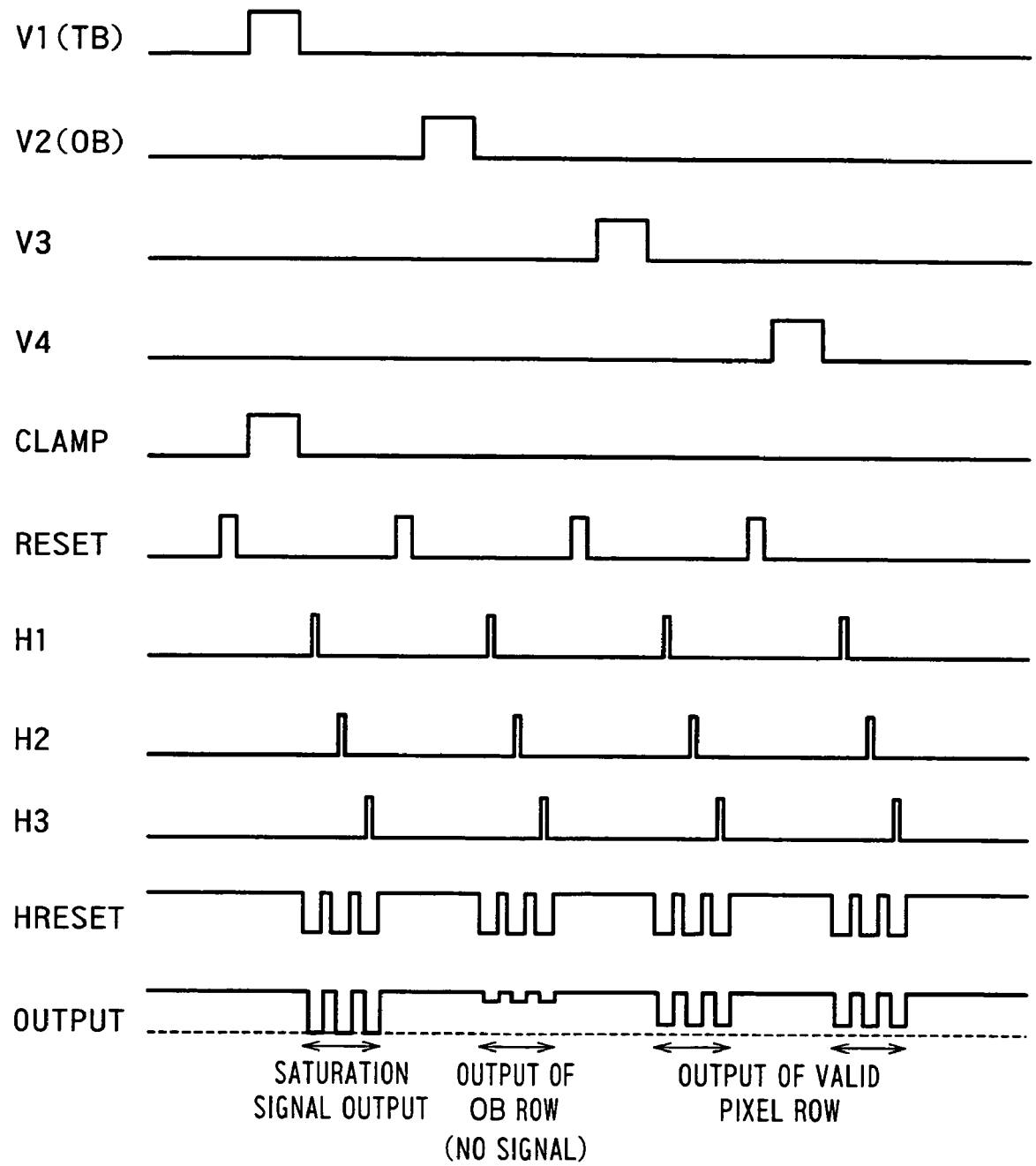
FIG. 15 is a driving timing chart of an infrared sensor according to the second embodiment of the present invention.
Figure 16:
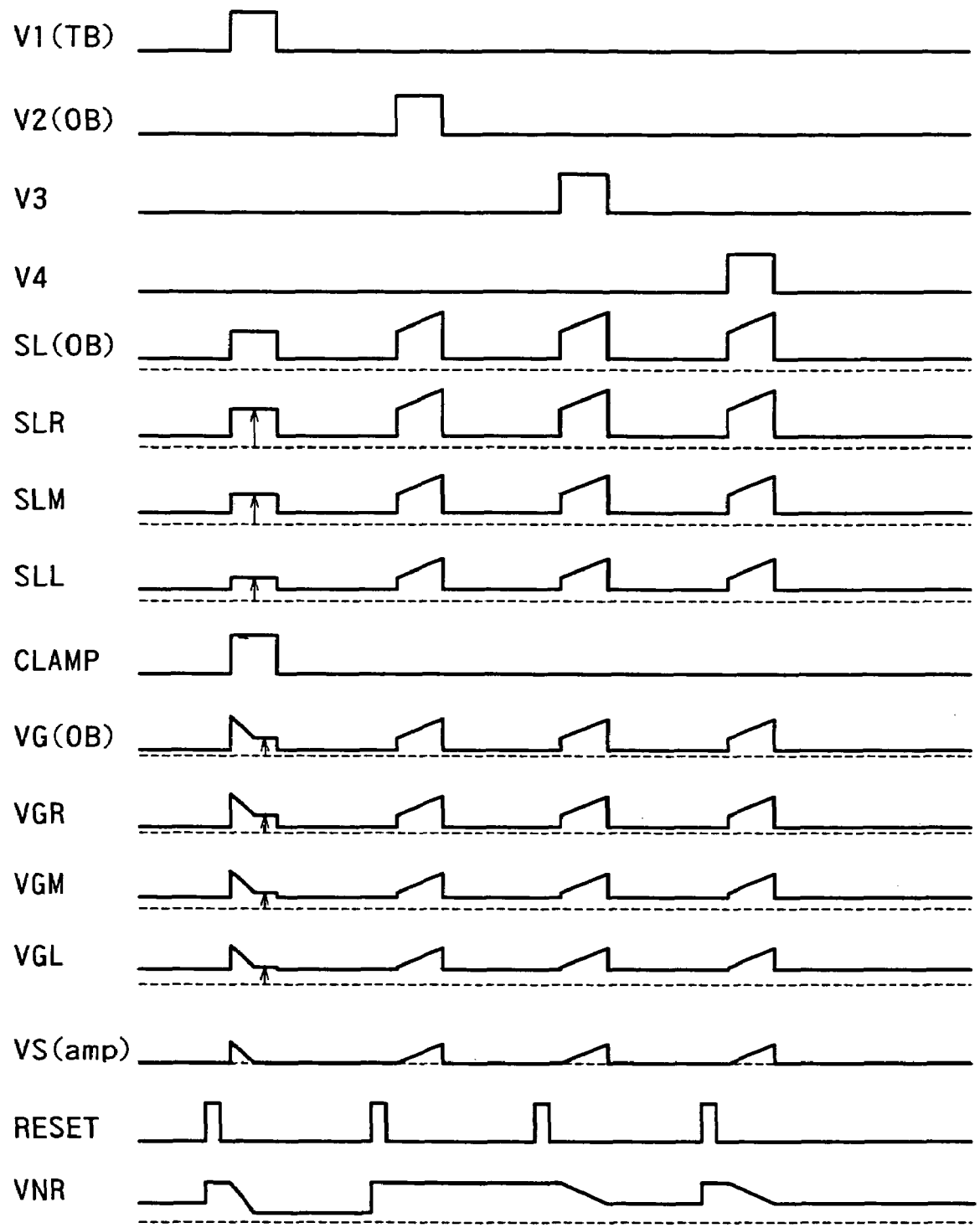
FIG. 16 is a driving timing chart showing a process of canceling the self heating signal and a process of preventing a shading in an infrared sensor according to the second embodiment of the present invention.

FIG. 15 and FIG. 16 are drive timing charts according to the present embodiment. The timing chart shown in FIG. 15 is substantially the same as that shown in FIG. 10 according to the first embodiment, and therefore, explanation thereof is omitted. FIG. 16 corresponds to FIG. 11 according to the first embodiment, and contents of many parts in FIG. 16 are the same as those in FIG. 11. However, a behavior of the infrared sensor during a clamp operation is different from that according to the first embodiment, and therefore, this part is explained.

The clamp operation is carried out using the thermal non-sensitivity pixel row of the first row, like in the first embodiment.

An output of the vertical signal line appears in the form of including shading as shown by SLR, SLM, and SLL.

At this time, a clamp pulse is a high level. Therefore, the clamp transistors 76 and 760 of the column amplifier 7 and the OB signal generator 8 are turned ON. Gates of the amplifying transistors 75 and 750 are short-circuited with the drains of the amplifier transistors 75 and 750. Drain voltages of the amplifier transistors 75 and 750 are initialized to the reset voltage VRS by the reset pulse. Therefore, the amplifying transistor is turned ON, and a drain current flows, thereby modulating the integration capacitor voltage and the voltages of VNR, VNM, and VNL.

When a certain time elapses, the integration capacitor voltages VNR, VNM, and VNL decrease to a threshold voltage of the amplifying transistor. At this time, a current of the amplifying transistor stops, and a gate voltage of the amplifying transistor is clamped at the threshold voltage of each amplifying transistor.

VG (OB), VGR, VGM, and VGL show states of the gate voltages at this time. It is understood that shading information is canceled by this clamp operation.

VG (OB) is also clamped at the threshold voltage, and VS (amp) is zero. Therefore, Vgs (Vgs=VG−VS (amp)) becomes a threshold voltage of the amplifying transistor 75. A threshold voltage of the driving transistor 93 is equivalent to a threshold voltage of the amplifying transistor 750.

In the second row and the subsequent rows, shading is excluded in a similar manner to that according to the first embodiment, and therefore, explanation thereof is omitted.

A self heating component must be considered in the second row. Vth+VSH (t) is generated in all of the gate voltages VGR, VGM, VGL, and VG (OB). Therefore, the output VS (amp) of the OB signal generator 8 becomes Vth+VSH (t)−Vth=VSH (t). Accordingly, Vgs (Vgs=VG−VS (amp)) becomes Vth. In other words, the self heating component VSH (t) is canceled from Vgs of the amplifying transistor inside the column amplifier 7.

In the third row, a self heating component and a signal component must be considered. Vth+VSH (t)+Vsig is generated in the gate voltages VGR, VGM, and VGL. VG (OB) is the same as VG (OB) at the time of selecting the second row. Therefore, the output VS (amp) becomes VSH (t). Accordingly, Vgs (Vgs=VG−VS (amp)) becomes Vth+Vsig. As a result, according to the second embodiment, the self heating component VSH (t) can be canceled from Vgs of the amplifying transistor inside the column amplifier 7, and the signal component Vsig can be detected, in a similar manner to that according to the first embodiment.

In the fourth row and the subsequent rows, the influence of the self heating can be excluded in the operation similar to that in the third row.

According to the second embodiment, a clamp operation can be carried out without supplying a clamp voltage from the outside. In the clamp operation, threshold value information of each amplifying transistor and threshold value information of the driving transistor 93 of the column buffer 9 can be clamped. Therefore, fixed pattern noise attributable to a variance in the threshold value of the amplifying transistor and a variance in the threshold value of the driving transistor 93 in the column buffer 9 can be also excluded within a chip, which is more preferable.

Third Embodiment

Figure 17:
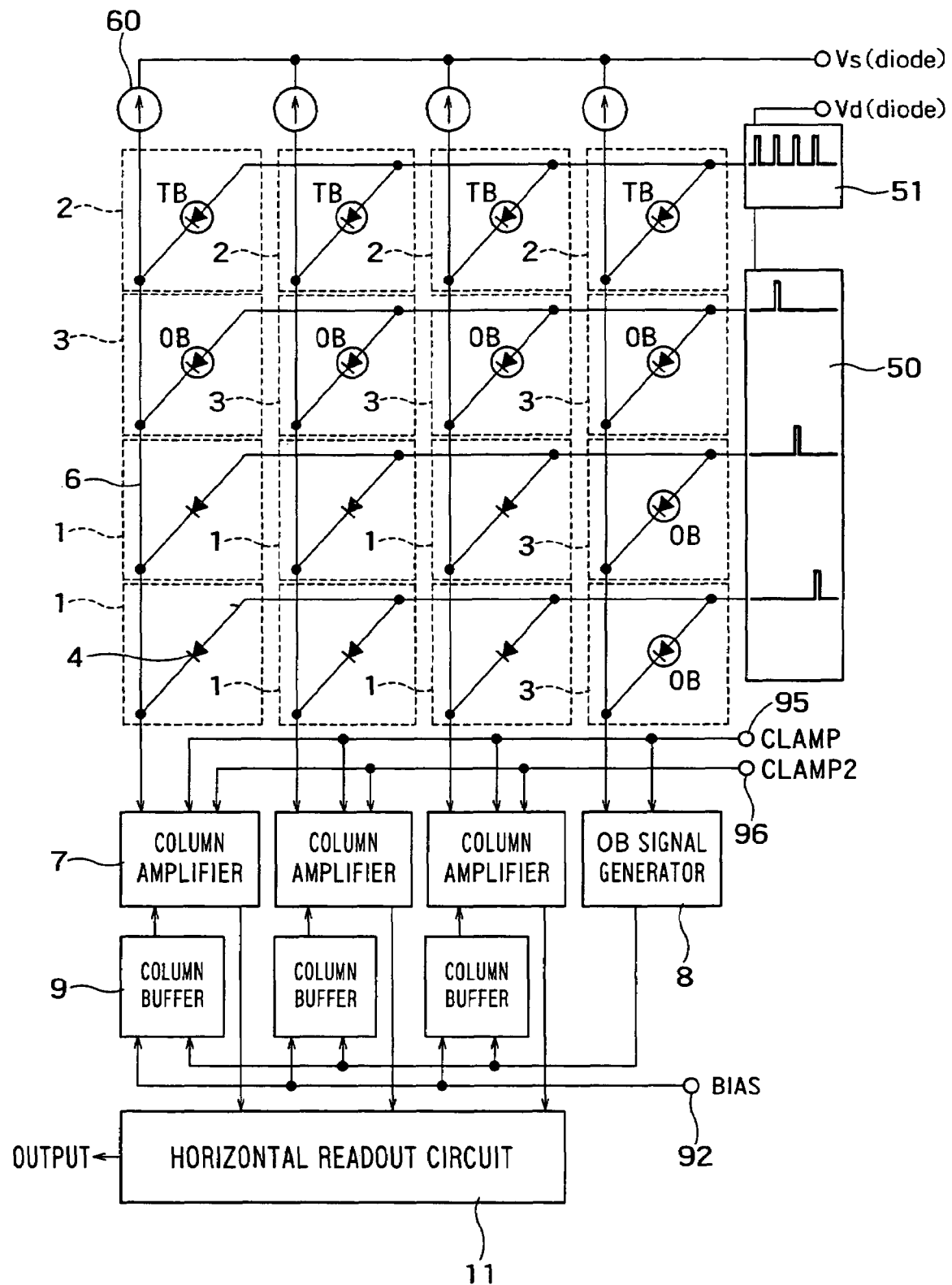
FIG. 17 is an explanatory diagram of an entire configuration of an infrared sensor according to a third or a fourth embodiment of the present invention.

An infrared sensor according to a third embodiment of the present invention is explained next. FIG. 17 is a diagram showing an entire configuration of the infrared sensor according to the third embodiment. FIG. 17 corresponds to FIG. 1 according to the first embodiment.

The present embodiment is different from the first embodiment in two points. The first difference is that a selection of the thermal non-sensitivity pixel row of the first row is carried out by a pulse generator 51 different from the row select circuit 50 that is used to select other rows. The pulse generator 51 generates a pulse always earlier than the row selection pulse of other rows. In other words, the thermal non-sensitivity pixel row of the first row is selected before a certain other row is selected. The second difference is that two clamp pulses are input to the column amplifier.

Figure 18:
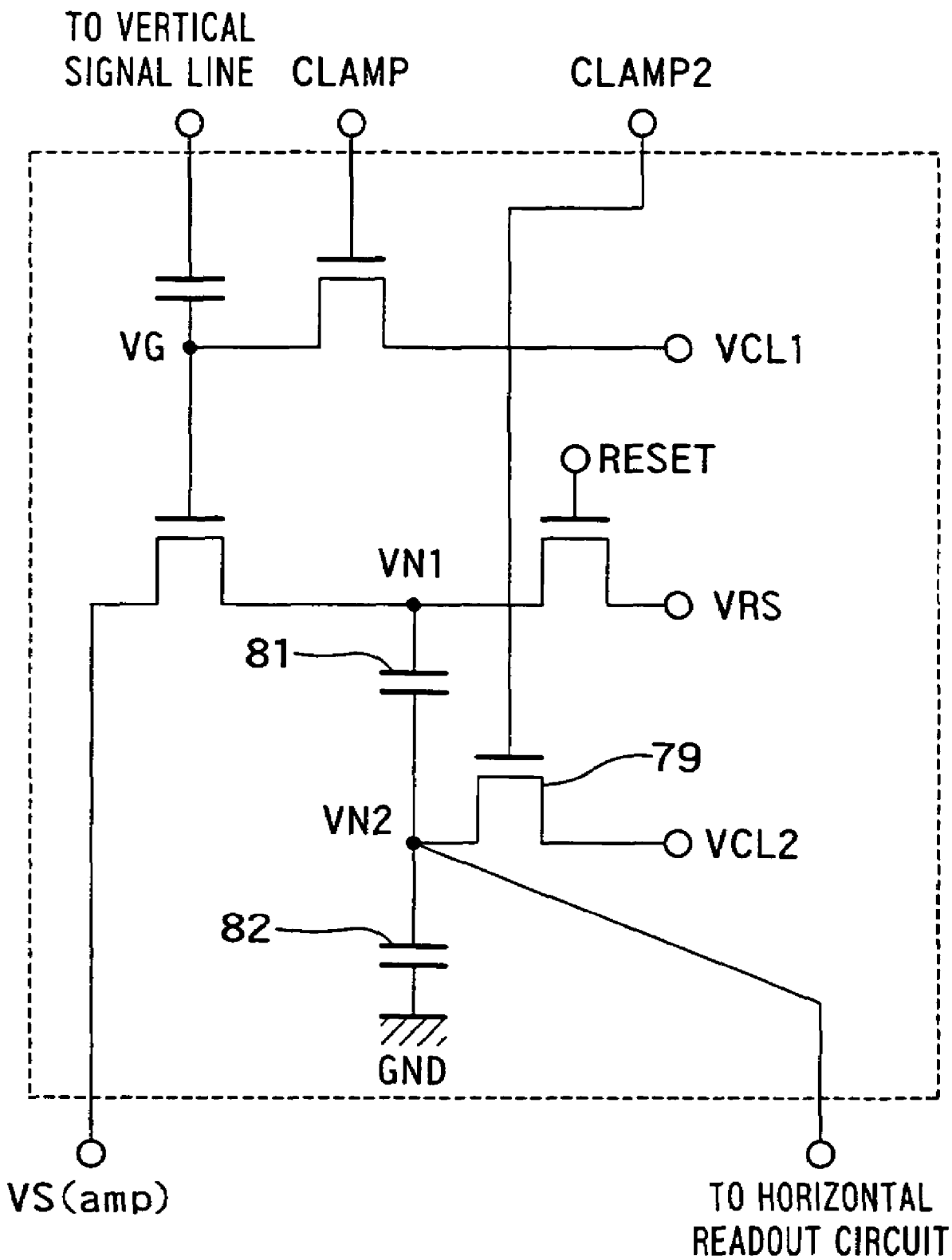
FIG. 18 is a circuit diagram of a column amplifier according to the third embodiment of the present invention.

FIG. 18 shows a configuration of the column amplifier according to the present embodiment. Constituent parts of the column amplifier identical with those of the configuration in FIG. 6 are assigned with like reference numerals. In the present embodiment, a part that relates to an input of a second clamp is added to the configuration shown in FIG. 6 according to the first embodiment.

According to a second clamp transistor 79, its drain is connected to a clamp voltage VCL2 of an external input, its source is connected to a drain of the amplifying transistor 75 via a second coupling capacitor 81, and the source is grounded via a clamp capacitor 82. In the present embodiment, the OB signal generator 8, the column buffer 9, and the horizontal signal readout circuit 11 can be the same as those according to the first embodiment, and the configurations shown in FIGS. 7, 8, and 9 can be directly employed.

Figure 20:
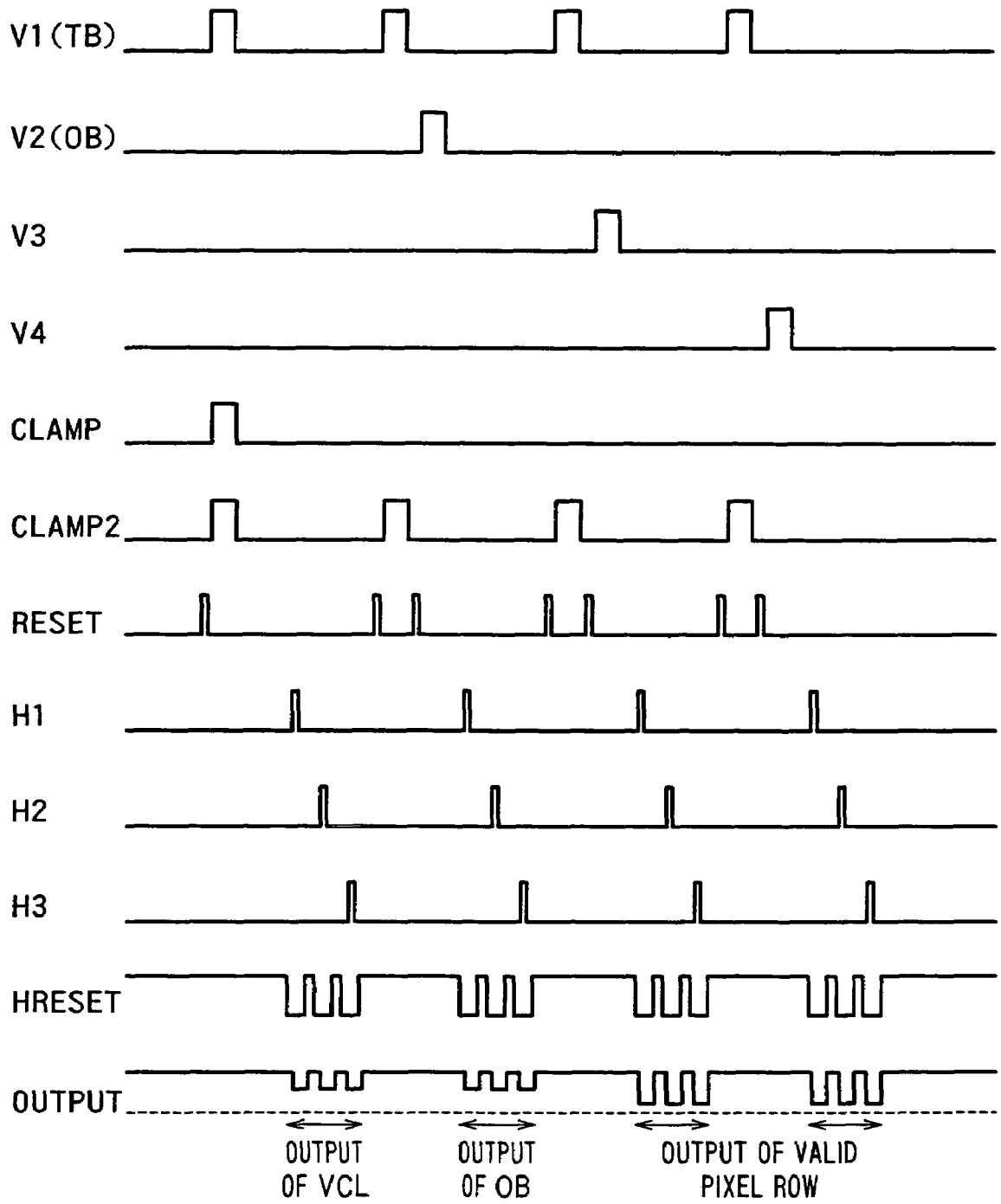
FIG. 20 is a driving timing chart of an infrared sensor according to the third or the forth embodiment of the present invention.

FIG. 20 shows a timing chart according to the present embodiment.

First, the column amplifier is initialized by the reset pulse RESET. Following this, the selection pulse V1 in the first row as the thermal non-sensitivity pixel row becomes a high level, and the clamp pulse (CLAMP) and a second clamp pulse (CLAMP 2) become high levels at the same time. Based on the clamp operation in the state that the thermal non-sensitivity pixel row is selected, the gate voltages VG and VG (OB) are clamped at the clamp voltage VCL in the form of taking in the voltage distribution information generated inside the row selection line 5. At the same time, a voltage VN2 of the clamp capacitor is clamped at VCL2. Therefore, shading attributable to the voltage distribution of the row selection line can be excluded. This operation is similar to that according to the first embodiment.

At this time, in the OB signal generator, the gate voltage VG (OB) is clamped at VCL in a manner similar to that according to the first embodiment. This gate voltage VG (OB) is input to the gate of the driving transistor 93 of the column buffer 9. Therefore, the gate-source voltage Vgs of the amplifying transistor 75 of the column amplifier 7 becomes Vth, and a drain current does not flow. A drain voltage VN1 of the amplifying transistor 75 remains at VRS. After the first row selection V1 pulse, the first clamp pulse, and the second clamp pulse become low levels, the horizontal readout circuit operates, and sequentially outputs voltages of the three columns. The voltage output this time is VN2 that is clamped at VCL2, and the output becomes VCL2. This output is not a useful output, in especially. The pulse CLAMP2 synchronized the pulse CLAMP is not imperative and may be omitted.

The purpose of the first row selection and the clamp operation is similar to that according to the first embodiment. In other words, the purpose is to clamp the gate voltages VG and VG (OB) of the column amplifier and the OB signal generator at VCL1 in the state that shading occurs in the vertical signal line. The operation of the horizontal readout circuit is the same as that according to the first embodiment.

After the column amplifier is initialized by the reset pulse, the V1 (TB) pulse for selecting the thermal non-sensitivity pixel row of the first row becomes a high level, and only the second clamp pulse becomes a high level at the same time.

Since the same row as that when the clamp operation is carried out is selected, Vo is generated as a potential of the vertical signal line, and VCL appears as the gate voltages VG and VG (OB). Therefore, no current flows through the amplifying transistor 75, and VRS is maintained as the drain voltage VN1. Based on the clamp operation, VN2 is maintained at VCL2. Accordingly, dark information in the state of VN1=VRS is held in the second and the third coupling capacitors 81 and 82.

The column amplifier 7 is initialized by the reset pulse RESET, and the V2 pulse for selecting the optical non-sensitivity pixel in the second row becomes a high level. A voltage (Vo+VSH (t)) including the self heating component is generated in the vertical signal line. However, the OB signal generator 8 modulates the source voltage of the amplifying transistor 75 via the column buffer 9, and the self heating component VSH (t) is canceled. As a result, no current passes through the column amplifier 7, and a dark level of VN1=VRS is generated.

When a dark level is stably obtained at the time of selecting the thermal non-sensitivity pixel row and at the time of selecting the optical non-sensitivity pixel row, the output VN2 remains at VCL2. The operation carried out at the time of selecting the valid pixel rows of the third row and the fourth row is basically the same as the operation at the time of selecting the second row. In this case, instead of VCL2, an output including a change corresponding to the signal output in the valid pixel appears in the output VN2. The self heating component VSH (t) is also canceled this time as described above.

By carrying out the second clamp, there is an effect that the influence of fluctuation in the gate voltage VG in the first clamp operation can be excluded. In other words, the gate voltage of the amplifying transistor 75 to be clamped in each column is not exactly VCL, but the gate voltage is fluctuated statistically. The fluctuation of the gate voltage in each column becomes a cause of vertical streak fixed pattern noise. This phenomenon also occurs in the first and the second embodiments. Fixed pattern noise occurs in the first and the second embodiments.

However, the gate voltage clamp operation of the amplifying transistor 75 is carried out only once for each frame. Therefore, this fixed pattern noise has a correlation within the frame, and this noise can be removed by an external circuit according to a method of a correlation double sampling or the like.

In other words, the output of the second row according to the first and the second embodiments is a dark information output of the optical non-sensitivity pixel. In principle, a reset level voltage should be generated in all columns. However, the output of each column contains fixed pattern noise due to the fluctuation. Therefore, the dark output including this fixed pattern noise is held and stored for one row by an external circuit. This dark output is subtracted from the valid pixel output of the third and subsequent rows. With this arrangement, the fixed pattern noise having a correlation within the frame can be removed.

According to the present embodiment, prior to the selection of each row, the second clamp operation is carried out simultaneously with the selection of the thermal non-sensitivity pixel row. Based on this, VN2 is clamped at VCL2 when a dark output signal obtained from the thermal non-sensitivity pixel is generated in VN1. Accordingly, dark output information including the information of the fluctuation in the gate voltage VG that becomes the cause of the fixed pattern noise is held in the second coupling capacitor 81. In the sate that the second clamp transistor 79 is turned OFF and VN2 is floating, the optical non-sensitivity pixel row or the valid pixel row is selected. A potential change proportional to a change in the VN1 potential is generated in VN2. As a result, a signal voltage having no influence of the fluctuation is generated in VN2. In other words, fixed pattern noise attributable to the fluctuation in the gate voltage generated in the first clamp operation is removed.

The feature of the third embodiment lies in that the fixed pattern does not need to be excluded by an external circuit. In other words, immediately before the selection and amplification operation of each row, VN2 is clamped at VCL2 in the state that dark information including the statistical fluctuation information is generated at VN1 by using the thermal non-sensitivity pixel row. Following this, the optical non-sensitivity pixel row is selected, and the column amplifier that holds the same statistical fluctuation is operated. When there is a variance ΔVN1 of VN1, a variance ΔVN2 corresponding to this variance is generated, and the output is modulated. Based on the same principle as that of the cancellation of the shading information, when VN2 is clamped, the fluctuation in the gate voltage VG can be cancelled. A voltage variation corresponding to the difference between the valid pixel signal and the dark output signal appears in VN2.

As a result, according to the present embodiment, a high-sensitivity and wide dynamic range infrared sensor can be obtained.

Fourth Embodiment

Figure 19:
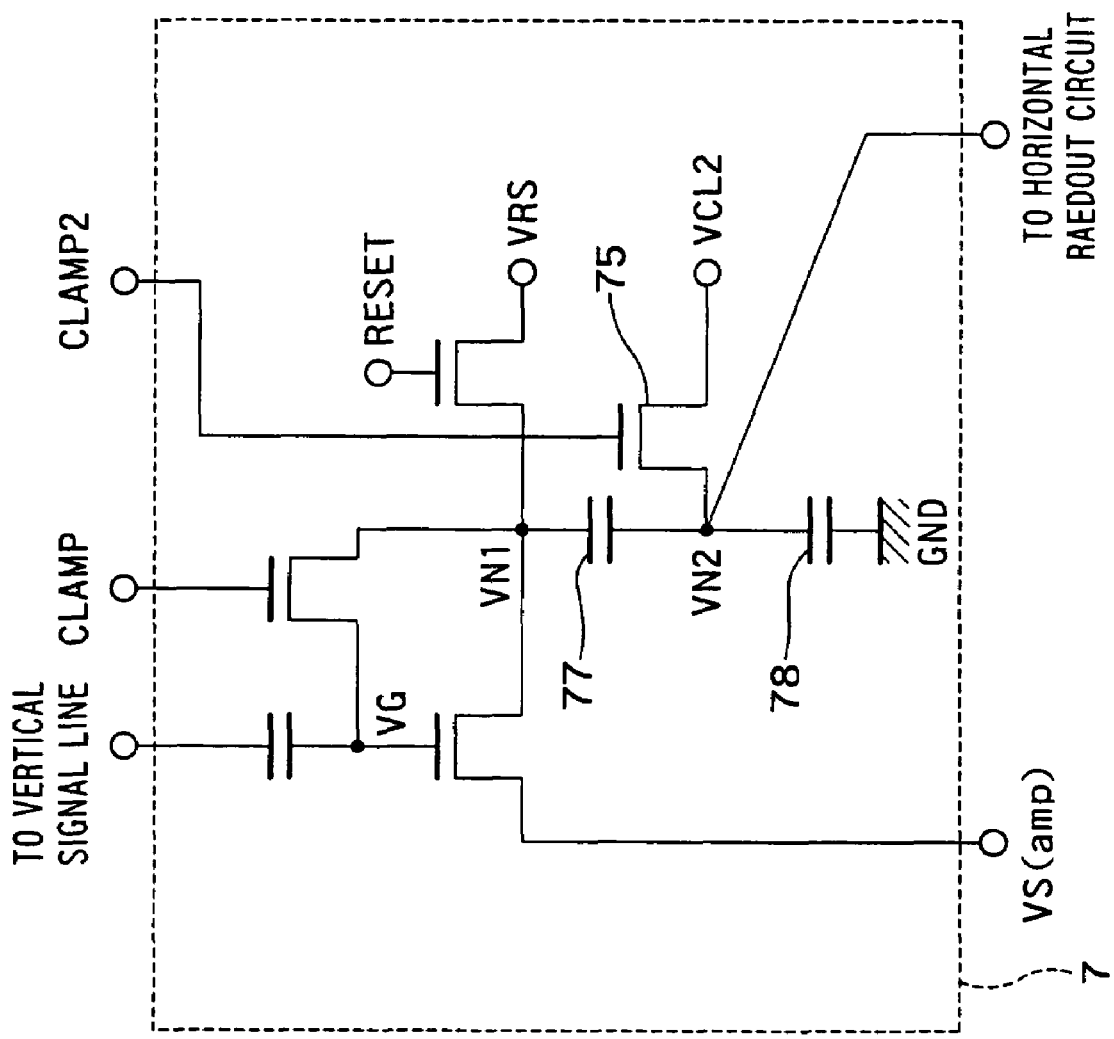
FIG. 19 is a circuit diagram of a column amplifier according to the fourth embodiment of the present invention.

FIG. 19 shows a configuration of a column amplifier according to a fourth embodiment of the present invention. An entire configuration of the infrared sensor according to the present embodiment is the same as that shown in FIG. 15 according to the third embodiment. Configurations of the column amplifier 7, the OB signal generator 8, and the column buffer 9 are different from those according to the third embodiment.

The configuration of the infrared sensor according to the present embodiment is a combination of the configurations of the infrared sensors according to the second and the third embodiments. Therefore, a basic configuration of the column amplifier is similar to that shown in FIG. 18 according to the third embodiment. However, the clamp voltage (CLAMP) is not supplied from the outside, but is determined inside the column amplifier in the same manner as that shown in FIG. 12 according to the second embodiment. Therefore, the clamp transistor is disposed between the gate and the drain of the amplifying transistor. The clamp voltage becomes the threshold voltage of the amplifying transistor 95 like in the second embodiment. The OB signal generator 8 and the column buffer 9 can have the same configurations as those shown in FIG. 13 and FIG. 14 according to the second embodiment. Functions and operations of the OB signal generator 8 and the column buffer 9 are the same as those according to the second embodiment.

The driving according to the present embodiment is basically the same as that according to the third embodiment, and the operation can be carried out using a timing chart shown in FIG. 20. First, the reading pulse of the first row is set to a high level, and the thermal non-sensitivity pixel row is selected. A voltage containing shading is generated in the vertical signal line 5. At the same time, the first clamp pulse (CLAMP) and the second clamp pulse (CLAMP 2) are set to high levels, and the gate voltages VG and VG (OB) are clamped at the threshold voltage of the amplifying transistor. These operations are the same as the operation principle according to the second embodiment. The operation is the same as that according to the third embodiment, except that the gate voltages VG and VG (OB) are clamped at the threshold voltage of the amplifying transistor.

The feature of the fourth embodiment lies in that the fixed pattern does not need to be excluded by an external circuit like in the third embodiment. Furthermore, like in the second embodiment, the influences of variance in the threshold voltage of the amplifying transistor and variance in the threshold voltage of the driving transistor of the column buffer circuit can be excluded. As a result, a high-sensitivity and wide dynamic range infrared sensor can be obtained.

In the third and the fourth embodiments, the second clump operation is carried out in the each column by the pulse V1 (TB) and the pulse CLAMP2 in advance of the amplifying operation in the each row selection period. However, since the first clump operation is carried out once for each flame, the second clump operation may be carried out once for each flame. In this case, the present embodiment may be modified as follows.

A buffer circuit is intervened between the output of the column amplifier 7 and the readout circuit 11 for the purpose of readout the terminal voltage at the column amplifier output node VN2 in a non-destructive manner. The buffer circuit may be comprised by a source follower circuit.

Further, the timing chart in FIG. 20 may be modified as follows. The embodiment uses the first one of pulses V1 (TB) and does not use the second one or later of pulses V1 (TB). And, the reset pulse before the second one or later of pulses V1 (TB) is not needed. Therefore, the second one or later of pulses V1 (TB) and the reset pulse may be omitted.

As described above, the pulse CLAMP2 may also be omitted.

The pulse CLAMP2 synchronized with the pulse V1 (TB) right before selecting the OB column by the pulse V2 (OB) is synchronized with the pulse V2 (OB). At this time, since the pulse V1 (TB) does not exist, the reset pulse RESET before the pulse V1 (TB) is also not needed.

In the operation of the third low or later, the clamp operation is not needed. Therefore, the pulse CLAMP2, the pulse V1 (TB) and the reset pulse RESET relevant to the clamp operation are also not needed.

In other words, the modification carries out the first clamp operation when selecting the first row of TB row, the second clamp operation when selecting the second row of OB row, and then, the modification readouts signals from the valid pixels on the third row or later.

Since, TB does not generate a self-heating, the second row is preferably to be configured by TB pixels instead of OB pixels. In this case, it is possible to use a circuit including the simple shift resister shown in FIG. 1 as a row select circuit. According to the configuration, the circuit can be simplified. Further, in the modification, since the amplifying period is hold as same as that of the first and the second embodiments, a signal bandwidth does not widen, and noise is restrained.

Fifth Embodiment

Figure 21:
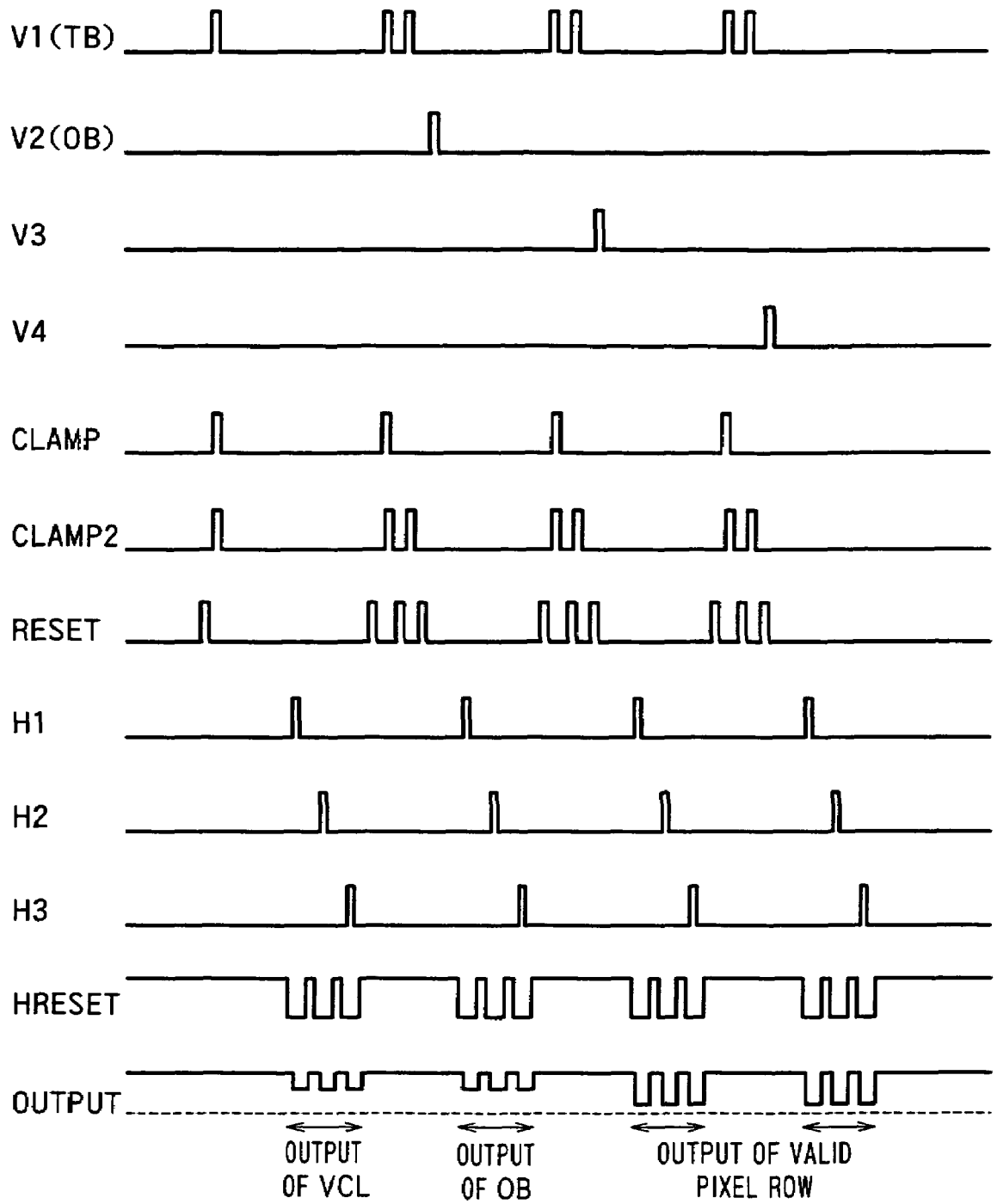
FIG. 21 is a driving timing chart of an infrared sensor according to a fifth embodiment of the present invention.

An infrared sensor according to a fifth embodiment of the present invention takes a device configuration shown in the third and the fourth embodiments, and is driven based on a timing chart shown in FIG. 21.

A basic operation of the timing chart shown in FIG. 21 is the same as that of the timing chart shown in FIG. 20. The first clamp operation based on the first clamp voltage is carried out to select the thermal non-sensitivity pixel row at the beginning. The gate voltages VG and VG (OB) of the amplifying transistors 95 and 950 of the column amplifier 7 and the OB signal generator 8 are clamped at VCL, or Vth of the amplifier transistor. This operation has an effect of canceling the shading in the horizontal direction. Prior to the selection of the second row and the subsequent rows, the thermal non-sensitivity pixel row is selected while carrying out the second clamp operation. This operation has an effect of canceling the influence of the fluctuation of the clamp voltage following the first clamp operation. Furthermore, the supply of the self heating information obtained from the OB signal generator 8 to the column amplifier via the column buffer has an effect of canceling the self heating signal component. These effects are common to the third/fourth embodiment.

In FIG. 20, the first clamp operation is carried out in only the selection of the head row to read each frame, and the first clamp voltage is held and used for one frame period. On the other hand, in FIG. 21, selection of the thermal non-sensitivity pixel row prior to the reading of each row is carried out two times. In the first selection of the thermal non-sensitivity pixel row, the first clamp operation is carried out for each row. These points are different between the fifth embodiment and the third/fourth embodiment.

In the present embodiment, the holding period of a clamp voltage following the clamp operation is as short as about one horizontal period. Therefore, specifications of the first clamp transistor 76 against leak characteristic are substantially mitigated. Accordingly, even when a leak current is at a certain high level due to variance of the manufacturing process, the first clamp transistor 76 can be used for the infrared sensor. As a result, production yield can be substantially improved.

While the configuration in which the column amplifier output is directly connected to the horizontal readout circuit is explained above, a sample holding circuit can be also provided between the output of the column amplifier and the horizontal readout circuit. In this case, the drive timing chart is not limited to those shown in FIG. 10, FIG. 15, FIG. 20, and FIG. 21. A row can be selected during a period when the horizontal readout circuit is operating. The row selection pulse width can be increased, and the signal band can be limited, and noise can be decreased. The provision of the sample holding circuit is preferable for these reasons.

Sixth Embodiment

Figure 22:
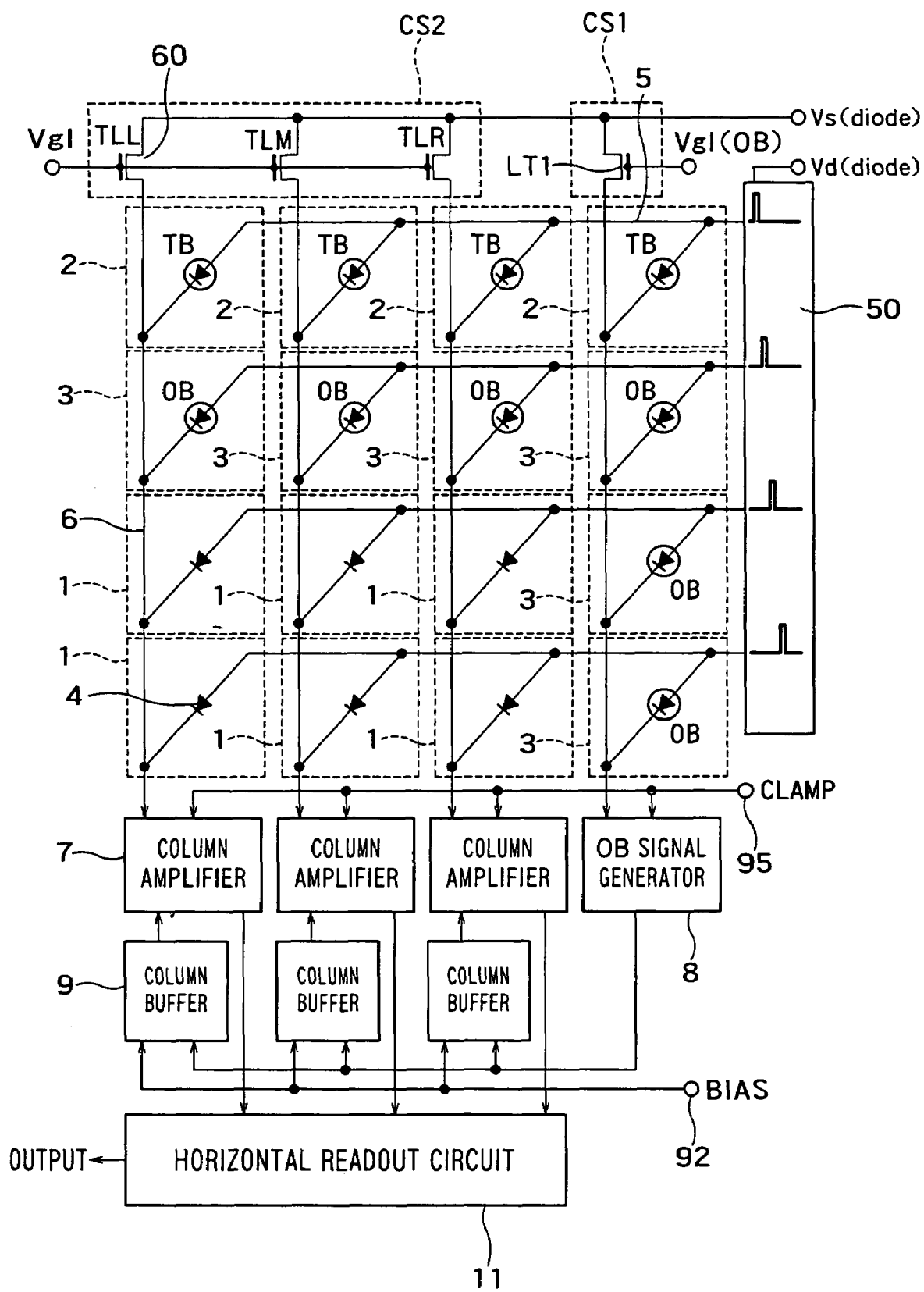
FIG. 22 is an explanatory diagram of an entire configuration of an infrared sensor according to a sixth embodiment of the present invention.

FIG. 22 is an entire configuration diagram of an uncooled infrared sensor according to a sixth embodiment of the present invention. The sixth embodiment is different from the second embodiment in that a first current source CS1 connected to the vertical signal line of the OB pixel column and a second current source CS2 connected to the vertical signal lines of other sensitivity pixel columns are provided separately. The first current source CS1 and the second current source CS2 can be controlled mutually independently. The sixth embodiment is also different from the second embodiment in that a source voltage Vs (OB) higher than a ground potential (0 V) is applied to the source of the amplifying transistor 750 of the OB signal generator 8. Other configurations according to the sixth embodiment can be the same as those according to the second embodiment. Therefore, the column amplifier 7, the OB signal generator 8, and the column buffer 9 are explained with reference to FIG. 12 to FIG. 14. In place of GND, the source voltage Vs (OB) is connected to the source of the amplifying transistor 750 shown in FIG. 14.

Figure 23:
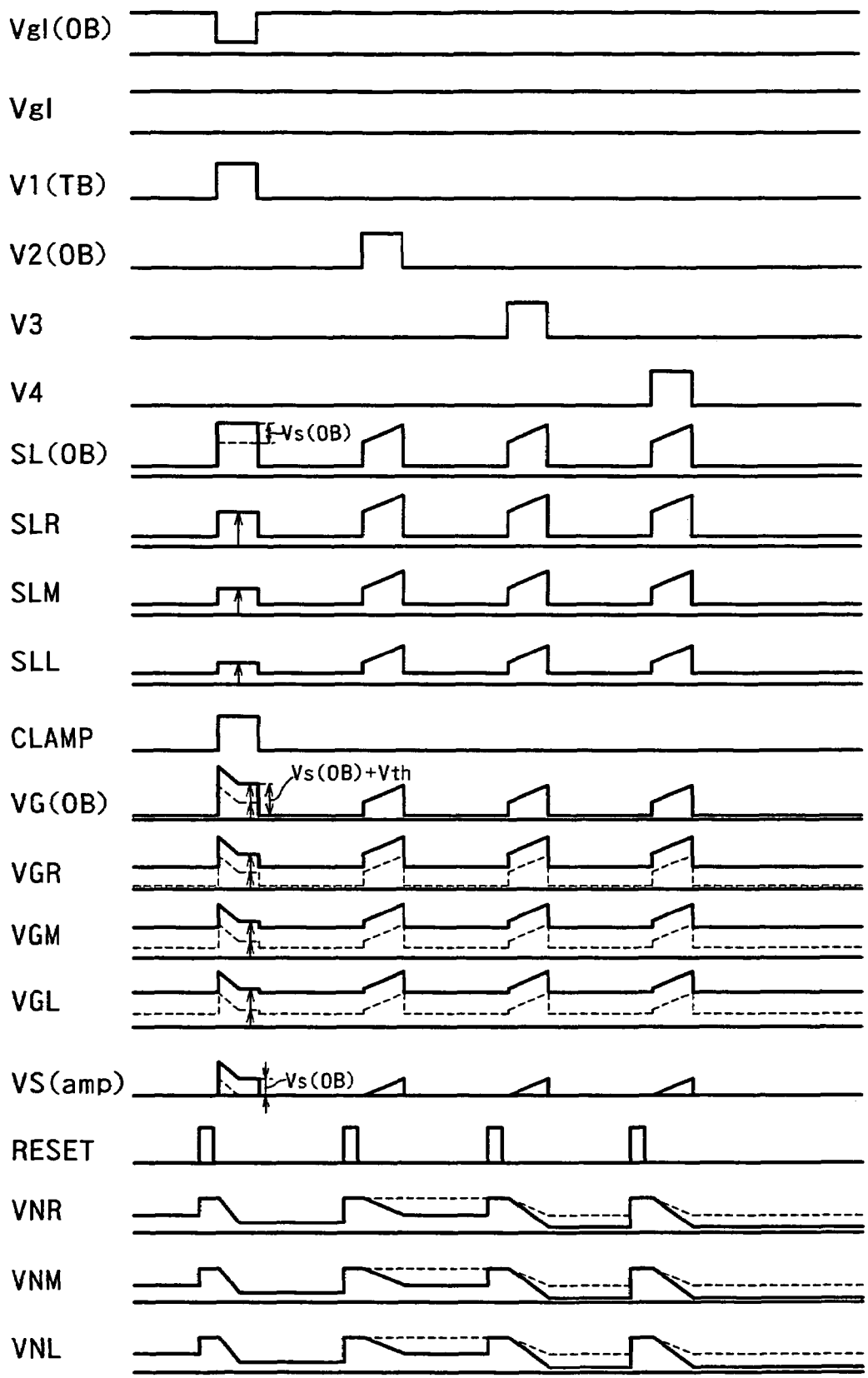
FIG. 23 is a timing chart showing a flow of an operation of an infrared sensor according to the sixth embodiment of the present invention.

The first current source CS1 has a load transistor LT1. A gate signal Vgl (OB) is input to the gate of the load transistor LT1. The gate signal Vgl (OB) is synchronous with the clamp signal CLAMP as shown in FIG. 23. During a clamp period, a low-voltage pulse is output. In other periods, the voltage returns to a normal predetermined voltage. As a result, the gate signal Vgl (OB) can be used to pulse drive the load transistor LT1 and control the current of the load transistor LT1.

On the other hand, the second current source CS2 has load transistors TLR, TLM, and TLL. The gate signal Vgl is input to the gates of the load transistors TLR, TLM, and TLL. The gate signal Vgl outputs a constant voltage as shown in FIG. 23. This constant voltage is the same as the predetermined voltage of the gate signal Vgl (OB). As a result, a constant current flows through the load transistors TLR, TLM, and TLL. In other words, the current source CS2 works as a constant current source.

As described above, during the clamp period, only the gate signal Vgl (OB) becomes a lower voltage than the predetermined voltage. During other periods, the gate signal Vgl (OB) returns to a predetermined voltage that is the same as the voltage of the gate signal Vgl.

In the second embodiment, signals corresponding to the gate signal Vgl (OB) and the gate signal Vgl are at a predetermined voltage. In FIG. 16, signals corresponding to these gate signals are omitted.

FIG. 23 is a timing chart showing a flow of the operation of the infrared sensor according to the sixth embodiment. A signal line shown by a broken line indicates the operation of the infrared sensor according to the second embodiment. In order to facilitate the understanding, the operation of the infrared sensor according to the sixth embodiment is explained in comparison with the operation according to the second embodiment.

First, the gate signal Vgl (OB) becomes a low voltage during the clamp period in synchronism with the clamp pulse CLAMP. During a period other than the clamp period, the gate signal Vgl (OB) is at the predetermined voltage. During the period other than the clamp period, the operation of the first current source CS1 may be the same as the operation of the constant current source according to the second embodiment. In other words, the first current source CS1 is pulse driven only during the clamp period, and the first current source CS1 can be regarded as the same constant current source as the second current source CS2 during other periods.

When the gate signal Vgl (OB) is outputting a low-voltage pulse, a current that flows from Vd (diode) shown in FIG. 22 to the power source Vs (diode) through a diode TB and the load transistor LT1 is relatively small.

A column voltage SL (OB) of the vertical signal line in the OB pixel column is expressed as Vd (diode)−Vdiode. Vdiode is a voltage applied to the diode TB or OB. Vdiode changes according to a current Idiode that flows through the diode TB, and has a positive correlation.

As described above, when the current that flows through the diode TB is small, a voltage drops in the diode TB, or Vdiode becomes small. Therefore, a voltage SL (OB) (SL (OB)=Vd(diode)−Vdiode) of the vertical signal line becomes high. As a result, the column voltage SL (OB) of the OB pixel column during the clamp period becomes larger than that according to the second embodiment, as shown in FIG. 23. A difference between the voltage SL (OB) during the clamp period according to the sixth embodiment and the voltage SL (OB) during the clamp period according to the second embodiment is expressed as Vs (OB).

Similarly to the second embodiment, at the beginning of the clamp period, a drain voltage of the amplifier transistor 750 shown in FIG. 14 is initialized to the reset voltage VRS by the reset pulse. Therefore, the amplifying transistor 750 is turned ON. After a lapse of a constant time since the clamp is started, the voltage VG (OB) drops to Vs (OB)+Vth. As a result, the amplifying transistor 750 is turned OFF. Consequently, the voltage VG (OB) is clamped at Vs (OB)+Vth.

During the clamp period, a voltage substantially equivalent to Vs (OB) is externally applied to the source of the amplifying transistor 750 of the OB signal generator 8. As a result, VG (OB) becomes a potential higher than that according to the second embodiment by Vs (OB). Since VG (OB) is higher than Vth by Vs (OB), the reset voltage VRS is higher than Vs (OB)+Vth to turn ON the amplifying transistor 750.

Since the voltage VG (OB) is clamped at Vs (OB)+Vth, the source voltage VS (amp) shown in FIG. 12 becomes (Vs (OB)+Vth)−Vth=Vs (OB). As a result, the gate voltages VGR, VGM, and VGL of the amplifying transistor 75 of each column amplifier 7 are clamped at Vs (OB)+Vth.

In the second embodiment, the gate voltages VGR, VGM, and VGL are clamped at the threshold voltage Vth. However, in the sixth embodiment, the gate voltages VGR, VGM, and VGL are clamped at Vth+Vs (OB) which is higher than the threshold voltage Vth.

During the clamp period, the gate signal Vgl is maintained at a predetermined voltage. Therefore, the voltages SLR, SLM, and SLL of the vertical signal line of the sensitivity pixel column are driven same as those according to the second embodiment.

After the clamp period, the voltage Vgl (OB) returns from a low voltage to a predetermined voltage. That is, a current from the first current source CS1 becomes equivalent to a current from the second current source CS2. In this state, the pixels in the second row to the fourth row are driven. The pixels in the second row to the fourth row are driven in the same method as that according to the second embodiment.

However, the gate voltage VG of the amplifying transistor 75 of each column amplifier 7 is clamped at Vth+Vs (OB). Therefore, the gate voltages VGR, VGM, and VGL become the voltage levels according to the second embodiment added by Vs (OB).

Accordingly, in the second row, Vgs (Vgs=VG−VS (amp)) becomes Vth+Vs (OB). In other words, the self heating component VSH (t) is canceled from Vgs of the column amplifier 7, and Vgs becomes higher than the threshold voltage Vth by Vs (OB). Therefore, unlike in the second embodiment, a current that flows through the amplifying transistor is generated, and a voltage change occurs in the integration capacitor voltages VNR, VNM, and VNL.

In the third row, Vgs (Vgs=VG−VS(amp)) becomes Vth+Vsig+Vs (OB). That is, the self heating component VSH (t) is canceled from Vgs of the column amplifier 7, and Vgs becomes the threshold voltage Vth+Vs (OB) including the signal component Vsig. Therefore, a voltage change according to Vsig occurs in addition to the voltage change in the second row, in the integration capacitor voltages VNR, VNM, and VNL.

The operation in the fourth row is the same as that in the third row, and therefore, explanation thereof is omitted.

Effects according to the sixth embodiment are explained while explaining a gain in the column amplifier 7. In general, the gain in the column amplifier 7 is given by the following Expression 1.

$$\text{Gain}=(Ti/Cs)*gm \quad \text{(Expression 1)}$$

where, Cs denotes a capacitance of the integration capacitor 73, Ti denotes an integration time of the integration capacitor 73, and gm denotes a conductance of the amplifying transistor 75. Furthermore, gm is proportional to (Vgs−Vth).

Accordingly, in the sixth embodiment, when offset is applied by Vs (OB) to set Vgs=Vth+Vs (OB), the gain in the column amplifier 7 becomes large. As a result, a fine signal component Vsig can be detected at high sensitivity.

Furthermore, the sixth embodiment has the effect similar to that according to the second embodiment.

In the sixth embodiment, a constant voltage Vs (OB) is applied to the source voltage of the amplifying transistor 750. However, this source voltage is not necessarily a constant voltage, and is sufficient when a voltage of about Vs (OB) is applied during the clamp period. During other period, the source voltage of the amplifying transistor 750 is not particularly limited. During a period other than the clamp period, the source voltage of the amplifying transistor 750 can be the ground voltage (0 V).

In order not to pass an unnecessary current to the OB signal generator 8 during a period other than the clamp period, it is preferable that Vs (OB) is substantially equal to or higher than the voltage Vs (OB) of the clamp period during a period other than the clamp period.

In the sixth embodiment, the offset quantity of Vgs can be optionally set by changing the current during the clamp of the first current source CS1. With this arrangement, an optional offset α can be applied to Vgs of the amplifying transistor 75 of the column amplifier 7. In other words, Vgs can be set as Vgs=Vth+α. As a result, the column amplifier 7 having a suitable gain corresponding to the signal component Vsig can be realized.

The sixth embodiment can obtain a higher performance infrared sensor by driven according to the timing chart shown in FIG. 20 of the third and the fourth embodiments, and by the column amplifier shown in FIG. 19. In this operation, Vgl (OB) is applied in synchronized with the pulse CLAMP.

As a result, the sixth embodiment can implement a camera circuit which does not need to remove the fixed pattern noise by using an external circuit. Furthermore, like in the second embodiment, the influences of variance in the threshold voltage of the amplifying transistor and variance in the threshold voltage of the driving transistor of the column buffer circuit can be excluded. As a result, a high-sensitivity and wide dynamic range infrared sensor can be obtained.

The second clamp operation is carried out in the each row by the pulse V1 (TB) and the pulse CLAMP2 in advance of the amplifying operation in the each row. However, since the first clump operation is carried out once for each flame, the second clump operation may be carried out once for each flame. In this case, the present embodiment may be modified as follows.

A buffer circuit is intervened between the output of the column amplifier 7 and the readout circuit 11 for the purpose of readout the terminal voltage at the column ampifier output node VN in a non-destructive manner. The buffer circuit may be comprised by a source follower circuit.

Further, the timing chart in FIG. 20 may be modified as follows. The embodiment uses the first one of pulses V1 (TB) and does not use the second one or later of pulses V1 (TB). And, the reset pulse before the second or later of pulse V1 (TB) is not needed. Therefore, the second one or later of pulses V1 (TB) and the reset pulse may be omitted.

As described above, the pulse CLAMP2 may also be omitted.

The pulse CLAMP2 synchronized with the pulse V1 (TB) right before selecting the OB column by the pulse V2 (OB) is synchronized with the pulse V2 (OB). At this time, since the pulse V1 (TB) does not exist, the reset pulse RESET before the pulse V1 (TB) is also not needed.

In the operation of the third low or later, the clamp operation is not needed. Therefore, the pulse CLAMP2, the pulse V1 (TB) and the reset pulse RESET relevant to the clamp operation are also not needed.

In other words, the modification carries out the first clamp operation when selecting the first row of TB row, the second clamp operation when selecting the second row of OB row, and then, the modification readouts signals from the valid pixels on the third row or later.

Since, TB does not generate a self-heating, the second column is preferably to be configured by TB pixels instead of OB pixels. In this case, it is possible to use a circuit including the simple shift resister shown in FIG. 1 as a column selection circuit. According to the configuration, the circuit can be simplified. Further, in the modification, since the amplifying period is hold as same as that of the first and the second embodiments, increasing of signal bandwidth does not rise, and noise is restrained.

Seventh Embodiment

Figure 24:
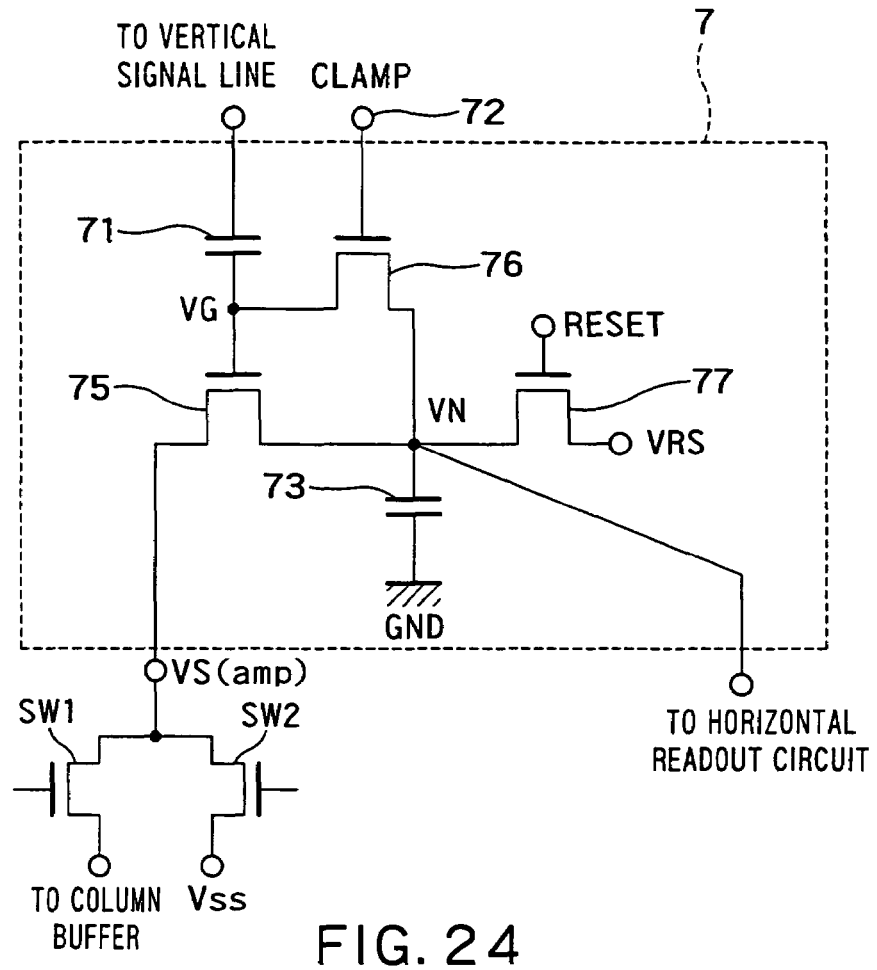
FIG. 24 is a circuit diagram of a column amplifier of an infrared sensor according to a seventh embodiment of the present invention.
Figure 25:
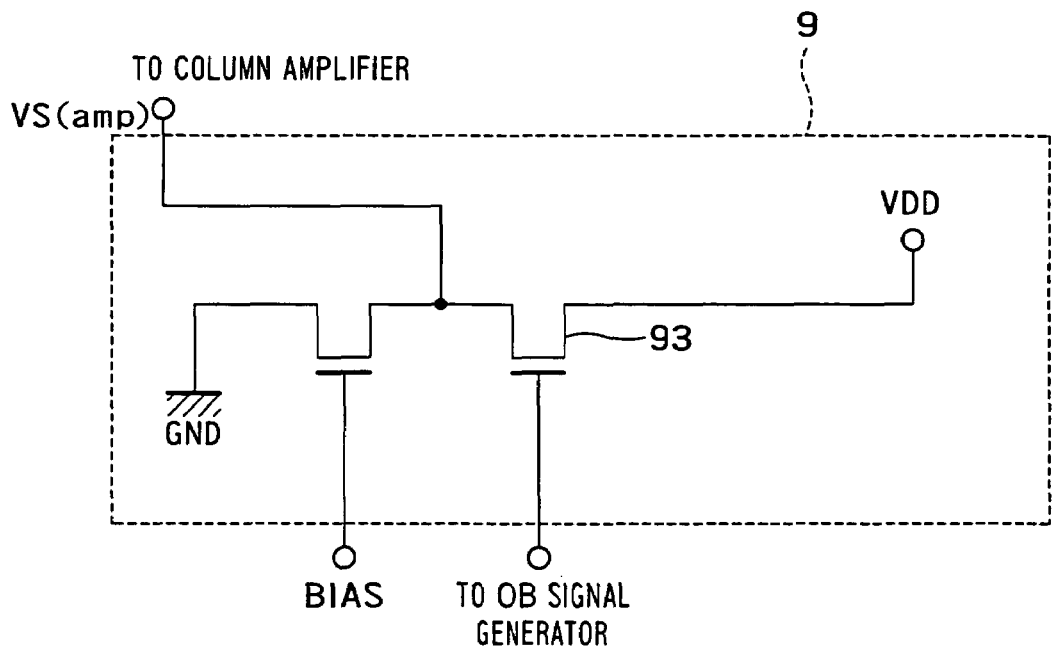
FIG. 25 is a circuit diagram of a column buffer of the infrared sensor according to the seventh embodiment.

FIG. 24 is a circuit diagram of a column amplifier of an infrared sensor according to a seventh embodiment of the present invention. FIG. 25 is a circuit diagram of a column buffer of the infrared sensor according to the seventh embodiment. The seventh embodiment is different from the sixth embodiment in the method of applying an offset to Vgs of the amplifying transistor 75.

As shown in FIG. 24 and FIG. 25, a switching element SW1 is disposed between the column amplifier 7 and a column buffer 8. A switching element SW2 is disposed between the column amplifier 7 and a power source Vss. The switching element SW1 and the switching element SW2 can be MOSFETs.

More specifically, the switching element SW1 is provided between a Vs (amp) terminal in FIG. 24 and a Vs (amp) terminal in FIG. 25. The switching element SW1 is turned OFF in synchronism with the clamp pulse CLAMP. Based on this, the column amplifier 7 can be separated from the column buffer 8.

The switching element SW2 is provided between the Vs (amp) terminal and the power source Vss shown in FIG. 24. The switching element SW2 is turned ON in synchronism with the clamp pulse CLAMP. Based on this, the source voltage Vs (amp) of the column amplifier 7 can be connected to the power source Vss only during the clamp period.

The power source Vss can be set optionally. Therefore, when the source voltage Vs (amp) is set to a predetermined voltage only during the clamp period, an offset can be applied to Vgs in the seventh embodiment like in the sixth embodiment.

Therefore, the seventh embodiment has an effect similar to that of the sixth embodiment.

However, according to the configuration of the seventh embodiment, another problem of vertical streak fixed pattern noise arises. This noise occurs due to the following reason.

According to the seventh embodiment, the positive voltage Vss is directly applied to Vs (amp) during the clamp. On the other hand, during the amplification operation, a voltage containing the self heating component is supplied to Vs (amp) via the column buffer 8.

At this time, a variance of the threshold voltage of the driving transistor 93 in the column buffer 8 corresponding to the pixel column is reflected to the voltage supplied from the column buffer 8. As a result, during the amplification operation, the variance of the threshold voltage of the driving transistor 93 is reflected to Vgs of the amplifying transistor 75. Consequently, the vertical streak fixed pattern noise appears in the output voltages VNR, VNM, and VNL.

Considering this problem, the sixth embodiment is more preferable than the seventh embodiment. According to the sixth embodiment, Vs (amp) is supplied from the column buffer 8 also during the clamp period. Therefore, a voltage containing the variance of the threshold voltage of the driving transistor 93 is clamped by the amplifying transistor 75 of the column amplifier 7.

As a result, during the amplification operation, the variance component of the threshold voltage of the driving transistor 93 is cancelled, and the above noise is not generated in the output voltages VNR, VNM, and VNL.

Consequently, the sixth embodiment is more preferable than the seventh embodiment in that the gain of the column amplifier 7 can be adjusted without increasing the fixed pattern noise.

The seventh embodiment can obtain a higher performance infrared sensor by driven according to the timing chart shown in FIG. 20, and by the column amplifier shown in FIG. 19 of the third and the fourth embodiments. In this operation, Vgl (OB) is applied in synchronized with the pulse CLAMP.

As a result, the sixth embodiment can implement a camera circuit which does not need to remove the fixed pattern noise by using an external circuit. Furthermore, like in the second embodiment, the influences of variance in the threshold voltage of the amplifying transistor and variance in the threshold voltage of the driving transistor of the column buffer circuit can be excluded. As a result, a high-sensitivity and wide dynamic range infrared sensor can be obtained.

The second clamp operation is carried out in the each row by the pulse V1 (TB) and the pulse CLAMP2 in advance of the amplifying operation in the each row. However, since the first clump operation is carried out once for each flame, the second clump operation may be carried out once for each flame. In this case, the present embodiment may be modified as follows.

A buffer circuit is intervened between the output of the column amplifier 7 and the readout circuit 11 for the purpose of readout the terminal voltage at the column amplifier output node VN in a non-destructive manner. The buffer circuit may be comprised by a source follower circuit.

Further, the timing chart in FIG. 20 may be modified as follows. The embodiment uses the first one of pulses V1 (TB) and does not use the second one or later of pulses V1 (TB). And, the reset pulse before the second one or later of pulse V1 (TB) is not needed. Therefore, the second one or later of pulses V1 (TB) and the reset pulse may be omitted.

As described above, the pulse CLAMP2 may also be omitted.

The pulse CLAMP2 synchronized with the pulse V1 (TB) right before selecting the OB column by the pulse V2 (OB) is synchronized with the pulse V2 (OB). At this time, since the pulse V1 (TB) does not exist, the reset pulse RESET before the pulse V1(TB) is also not needed.

In the operation of the third low or later, the clamp operation is not needed. Therefore, the pulse CLAMP2, the pulse V1 (TB) and the reset pulse RESET relevant to the clamp operation are also not needed.

In other words, the modification carries out the first clamp operation when selecting the first row of TB row, the second clamp operation when selecting the second row of OB column, and then, the modification readouts signals from the valid pixels on the third row or later.

Since, TB does not generate a self-heating, the second column is preferably to be configured by TB pixels instead of OB pixels. In this case, it is possible to use a circuit including the simple shift resister shown in FIG. 1 as a column selection circuit. According to the configuration, the circuit can be simplified. Further, in the modification, since the amplifying period is hold as same as that of the first and the second embodiments, increasing of signal bandwidth does not rise, and noise is restrained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. An infrared sensor comprising:
    an imaging area which infrared detection pixels are disposed on a semiconductor substrate, the imaging area including a row of thermal non-sensitivity pixels, a row of optical non-sensitivity pixels and a row of valid pixels detecting infrared, and including a column of optical non-sensitivity pixels in an area of the valid pixels row;
    row selection lines disposed in a row direction within the imaging area;
    signal lines disposed in a column direction within the imaging area;
    a row selecting circuit connected to the row selection lines;
    a column amplifier including a first coupling capacitor, a first amplifying transistor, a first clamp circuit, an integration capacitor and a resetting part, a gate of the first amplifying transistor, being connected to one of the signal lines via the first coupling capacitor, the first clamp circuit clamping a gate voltage of the first amplification transistor at a clamping voltage, the integration capacitor being connected to a drain of the first amplifying transistor, the resetting part being connected to the drain of the first amplifying transistor and a storage node of the integration capacitor, the column amplifier being connected to each of the signal lines and amplifying a signal voltage generated in the signal line;
    a column buffer, including a driving transistor, a source of the driving transistor being connected to a source of the first amplifying transistor;
    a reading circuit that is connected to the storage node of the integration capacitor, and reads an output signal from the column amplifier; and
    a signal generating circuit for the column of the optical non-sensitivity pixel, the signal generating circuit including a circuit configuration equivalent to that of the column amplifier, the circuit configuration including a second amplifying transistor equivalent to the first amplifying transistor, a gate of the second transistor being connected to a gate of the driving transistor.

2. The infrared sensor according to claim 1, wherein the column buffer is a source follower circuit receiving a gate voltage of the second amplifying transistor.

3. The infrared sensor according to claim 1, wherein a threshold value of the driving transistor is substantially equal to that of the first amplifying transistor.

4. The infrared sensor according to claim 1, wherein the first clamp circuit includes a first clamp transistor, a clamp voltage of the first clamp circuit is a threshold voltage of the clamp transistor.

5. The infrared sensor according to claim 1, wherein the column amplifier further has a second clamp circuit, and the second clamp circuit includes a second coupling capacitor connected to the drain of the first amplifying transistor, a clamp capacitor, and a second clamp transistor connected to a junction between the second coupling capacitor and the clamp capacitor.

6. The infrared sensor according to claim 5, further comprising:
    a buffer circuit intervened between the column amplifier and the reading circuit.

7. The infrared sensor according to claim 6, wherein
    the buffer circuit being a source follower circuit whose input is connected to an output of the column amplifier.

8. The infrared sensor according to claim 1, further comprising: a first current source connected to the signal line of the optical non-sensitivity pixel column; and
    a second current source connected to the signal lines of a sensitivity pixel column other than the optical non-sensitivity pixel column, wherein
    the first current source is controlled independently of the second current source.

9. The infrared sensor according to claim 8, wherein the first current source supplies a smaller current than the second current source when the gate voltage of the first amplifying transistor is clamped.

10. The infrared sensor according to claim 8, wherein a positive voltage is applied to the source of the second amplifying transistor when the gate voltage of the first amplifying transistor is clamped.

11. The infrared sensor according to claim 10, wherein the positive voltage applied on the source of the second amplifying transistor is substantially equal to a potential difference between a potential of the signal line connected to the optical non-sensitivity pixel column and a potential of the signal line connected to the sensitivity pixel column.

12. The infrared sensor according to claim 1, further comprising:
  a first switching element provided between the source of the driving transistor and the source of the first amplifying transistor; and
  a second switching element provided between the source of the first amplifying transistor and a power source that can supply a variable voltage, wherein
  the first switching element is turned OFF, and the second switching element is turned ON when the gate voltage of the first amplifying transistor is clamped.

13. A method of driving an infrared sensor, the infrared sensor comprising an amplifying transistor including a gate capacity coupled with signal lines connected to a thermal non-sensitivity pixel row, an optical non-sensitivity pixel row, and a valid pixel row; a clamp circuit clamping a gate voltage of the amplifying transistor at a clamping voltage; a capacitor connected to a drain of the amplifying transistor and storing a signal charge from the amplifying transistor; a resetting part resetting a drain potential of the amplifying transistor and a potential of the storage capacitor; and a column amplifier connected to the signal lines and amplifying a signal voltage generated in the signal lines,
  the method comprising:
  making the clamp circuit conductive only during a selection of the thermal non-sensitivity pixel row.

14. A method of driving an infrared sensor, the infrared sensor comprising a first amplifying transistor including a gate capacity which is coupled with signal lines connected to a thermal non-sensitivity pixel row, an optical non-sensitivity pixel row, and a valid pixel row; a clamp circuit clamping a gate voltage of the first amplifying transistor at a clamping voltage; a capacitor connected to a drain of the first amplifying transistor and storing a signal charge from the first amplifying transistor; a resetting part resetting a drain potential of the first amplifying transistor and a potential of the storage capacitor; a column amplifier connected to the signal lines and amplifying a signal voltage generated in the signal lines; a first current source connected to the signal lines of the optical non-sensitivity pixel column; and a second current source connected to the signal lines of a valid pixel column,
  the method comprising:
  making the clamp circuit conductive during a selection of the thermal non-sensitivity pixel row; and
  controlling a current from the first current source in a pulse shape in synchronism with the operation of the clamp circuit.

15. The method of driving an infrared sensor according to claim 14, wherein the first current source and the second current source are controlled mutually independently.

16. The method of driving an infrared sensor according to claim 14, wherein the first current source supplies a smaller current than the second current source when the gate voltage of the first amplifying transistor is clamped.

17. The method of driving an infrared sensor according to claim 14,
  the infrared sensor further comprising:
  a column buffer including a driving transistor, a source of the driving transistor being connected to a source of the first amplifying transistor; and
  a signal generating circuit for an optical non-sensitivity pixel column, the signal generating circuit including a second amplifying transistor with the same configuration as that of the first amplifying transistor, a gate of the second amplifying transistor being connected to a gate of the driving transistor, wherein
  a positive voltage is applied to a source voltage of the second amplifying transistor when a gate voltage of the first amplifying transistor is clamped.

18. The method of driving an infrared sensor according to claim 17, wherein the positive voltage applied to the source of the second amplifying transistor is substantially equal to a potential difference between a potential of the signal lines connected to the optical non-sensitivity pixel column and a potential of the signal line connected to the valid pixel column.

19. The method of driving an infrared sensor according to claim 14,
  the infrared sensor further comprising:
  a first switching element provided between the source of the driving transistor and the source of the first amplifying transistor; and
  a second switching element provided between the source of the first amplifying transistor and a power source, wherein
  when the gate voltage of the first amplifying transistor is clamped, the first switching element is turned OFF, and the second switching element is turned ON.

* * * * *